US009123698B2

(12) United States Patent  (10) Patent No.: US 9,123,698 B2
Bhagavat et al.  (45) Date of Patent: Sep. 1, 2015

(54) FLEXURAL PLATE WAVE DEVICE FOR CHIP COOLING

(75) Inventors: Milind S. Bhagavat, Fremont, CA (US); Seyed Mahdi Saeidi, Irvine, CA (US); Tak Sang Yeung, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1026 days.

(21) Appl. No.: 13/173,456

(22) Filed: Jun. 30, 2011

(65) Prior Publication Data

US 2012/0050989 A1  Mar. 1, 2012

Related U.S. Application Data

(60) Provisional application No. 61/376,757, filed on Aug. 25, 2010.

(51) Int. Cl.
*H01L 23/34* (2006.01)
*H01L 23/467* (2006.01)
*H05K 7/20* (2006.01)

(52) U.S. Cl.
CPC ....... *H01L 23/467* (2013.01); *H01L 2924/0002* (2013.01); *H05K 7/20136* (2013.01); *H05K 7/20154* (2013.01)

(58) Field of Classification Search
CPC ........... H05K 7/20136; H05K 7/20154; H01L 23/46; H01L 23/467
USPC ........................ 361/679.46–679.54, 688–723; 165/80.1–80.3, 185; 257/712–713, 257/717, 721–722; 174/15.1, 16.1, 16.3; 310/346, 315
See application file for complete search history.

(56) References Cited

U.S. PATENT DOCUMENTS

| | | | | |
|---|---|---|---|---|
| 5,008,582 A * | 4/1991 | Tanuma et al. | ............... | 310/332 |
| 6,229,404 B1 * | 5/2001 | Hatanaka | ......................... | 331/68 |
| 6,849,910 B2 * | 2/2005 | Oberhardt et al. | ............ | 257/414 |
| 7,019,971 B2 * | 3/2006 | Houle et al. | .................. | 361/699 |
| 7,248,475 B2 * | 7/2007 | Paydar et al. | ................. | 361/695 |
| 7,336,486 B2 * | 2/2008 | Mongia | ......................... | 361/695 |
| 7,369,409 B2 * | 5/2008 | Yazawa | ......................... | 361/698 |
| 7,742,299 B2 * | 6/2010 | Sauciuc et al. | ................ | 361/695 |
| 7,990,705 B2 * | 8/2011 | Bult et al. | ...................... | 361/694 |
| 8,322,889 B2 * | 12/2012 | Petroski | ........................ | 362/294 |
| 8,776,871 B2 * | 7/2014 | Arik et al. | ..................... | 165/121 |
| 2006/0138905 A1 * | 6/2006 | Gonzales et al. | ............. | 310/331 |
| 2009/0190308 A1 * | 7/2009 | Bhattacharya et al. | ....... | 361/694 |
| 2010/0271775 A1 * | 10/2010 | Bult et al. | ..................... | 361/689 |

OTHER PUBLICATIONS

Bradley et al., "Flow Measurements in a Micromachined Flow System with Integrated Acoustic Pumping," Proceedings: IEEE Ultrasonics Symposium, vol. 1, (1995), pp. 505-510.

(Continued)

*Primary Examiner* — Zachary M Pape
(74) *Attorney, Agent, or Firm* — Fiala & Weaver P.L.L.C.

(57) ABSTRACT

Methods, systems, and apparatuses are described for cooling electronic devices. The electrical device includes an integrated circuit die (IC) having opposing first and second surfaces, a plurality of interconnects on the second surface of the IC die that enable the IC die to be coupled to a substrate, and a flexural plate wave device. The flexural plate wave device is configured to generate a stream of air to flow across the electrical device to cool the IC die during operation of the IC die.

22 Claims, 17 Drawing Sheets

(56) References Cited

OTHER PUBLICATIONS

Loh et al., "Acoustic Streaming Induced by Ultrasonic Flexural Vibrations and Associated Enhancement of Convective Heat Transfer," J. Acoust. Soc. Am., vol. 111 No. 2, Acoustical Society of America, Feb. 2002, pp. 875-883.

Kandil et al., "Computational and Physical Analysis of Active Vortex Generators," Aerospace Conference Proceedings, vol. 2, IEEE, Mar. 2000, pp. 121-127.

Black et al., "Microsphere Capture and Perfusion in Microchannels Using Flexural Plate Wave Structures," Proceedings: IEEE Ultrasonics Symposium, vol. 1, Oct. 2002, pp. 475-479.

* cited by examiner

FLEXURAL PLATE WAVE DEVICE FOR CHIP COOLING

This application claims the benefit of U.S. Provisional Application No. 61/376,757, filed on Aug. 25, 2010, which is incorporated by reference herein in its entirety.

BACKGROUND OF THE INVENTION

1. Field of the Invention

The invention relates generally to cooling techniques, and more particularly to techniques for cooling dies in integrated circuit packages.

2. Background

Integrated circuit (IC) dies are typically mounted in or on a package that is attached to a printed circuit board (PCB). Many types of IC packages exist, including leadless chip carriers (LCC), ball grid array (BGA) packages, quad flat packages (QFP), etc. One example advanced type of package is a wafer-level package. Different types of wafer-level packages exist, including wafer level chip scale packages (WLCSP), wafer level ball grid array (WLBGA) packages, and further types. Wafer level packages typically have an array of interconnects located on a bottom external surface of the package die, which may have the form of pads, posts, or balls/bumps (in the case of WLBGA packages). In a WLBGA package, an array of solder bump interconnects may be mounted directly to the die when the die has not yet been singulated from its fabrication wafer. As such, WLBGA packages do not include a package substrate. WLBGA packages can therefore be made very small, with high pin out, relative to other IC package types including traditional BGA packages.

IC packages often are subjected to high temperatures resulting from heat dissipation by circuitry during normal operation. These high temperatures can impair the performance of the circuits and/or cause thermal stresses in the package. Accordingly, a package sometimes includes one or more passive cooling devices, such as heat sinks, coupled to the IC die to facilitate conduction of heat away from the die. However, the mere introduction of passive cooling devices may not adequately dissipate heat from the IC die. Other techniques that are prevalent in industry use active system cooling devices, such as fans. However, in handheld devices and limited-space applications, it typically is not possible to incorporate system level cooling fans. A failure to adequately dissipate heat from the IC die may negatively affect the performance and/or reliability of the IC die.

BRIEF SUMMARY OF THE INVENTION

A system and/or method for actively cooling an electronic device using a flexural plate wave device, substantially as shown in and/or described in connection with at least one of the figures, as set forth more completely in the claims.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

Figure 1:
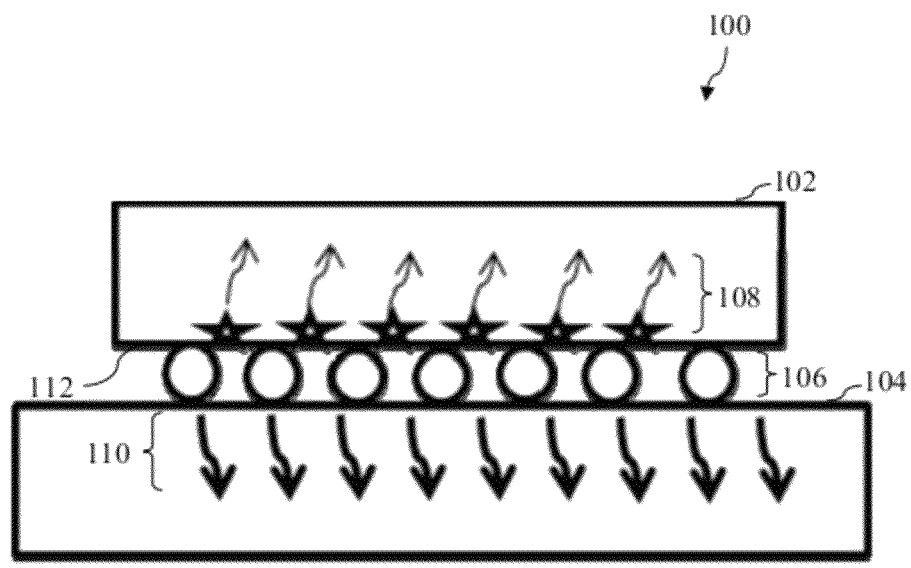
FIG. 1 shows a side view of a conventional integrated circuit (IC) package mounted to a substrate.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Introduction

The following detailed description refers to the accompanying drawings that illustrate example embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Various approaches are described herein for, among other things, cooling a chip using a flexural plate wave (FPW) device. The cooling techniques described herein are applicable to any suitable type of IC package, including but not limited to wafer level chip scale packages (WLCSPs) and wafer level ball grid array (WLBGA) packages. For example, packages that utilize the cooling techniques described herein may be relatively easy to fabricate, may dissipate heat more effectively than conventional packages, and/or may provide a competitive advantage in technologies that enable very small device features (e.g., 40 nm and lower technologies). Such cooling techniques can also be used as a system-level cooling solution where multiple chips are cooled using one FPW device (or larger numbers of FPW devices). Such techniques may be implemented in any type of commercially available and/or proprietary devices/systems, including stationary devices (e.g., desktop computers, displays (e.g., computer monitors, televisions such as flat panel displays, etc.), mobile devices (e.g., cell phones, smart phones, handheld computers laptop computers, netbooks, tablet computers, handheld music players, etc.), and further types of devices.

II. Example Chip Cooling Embodiments

FIG. 1 depicts a conventional integrated circuit (IC) package 100. As shown in FIG. 1, package 100 includes an IC die 102 that is coupled to a substrate 104 through electrically conductive interconnect elements 106. Examples of a conductive interconnect element 106 include but are not limited to a solder ball, a solder bump, etc. During operation of die 102, heat 108 is produced in die 102. The junction temperature at a bottom surface 112 of die 102 is represented as Tj. The junction temperature Tj represents a maximum temperature of surface 112 of die 102 during operation. Electrically conductive interconnect elements 106 may be configured to conduct at least some of heat 108 from die 102 into substrate 104. For instance, heat 110 is shown in FIG. 1 to be conducted into substrate 104. In one implementation, substrate 104 may be a printed circuit board (PCB), or may be an intermediate substrate that is coupled to a PCB through solder balls or other type of interconnects. In accordance with this example, heat 110 may be conducted through substrate 104 and the solder balls into the PCB.

Package 100 may be subjected to high temperatures resulting from heat 108. These high temperatures can impair the performance of the circuits of die 102 and/or cause thermal stresses in package 100. Accordingly, a passive cooling device, such as heat sink, may be coupled to die 102 to facilitate further conduction of heat 108 from die 102. However, the mere introduction of passive cooling devices may not adequately dissipate heat 108 from die 102. An active system cooling device, such as a fan, may be used to further dissipate heat 108 from die 102 (e.g., into the air surrounding die 102). However, if package 100 is incorporated in a mobile handheld device, or is used in other limited-space application, it typically is not possible to use a system level cooling fan with regard to package 100. A failure to adequately dissipate heat 108 from die 102 may negatively affect the performance and/or reliability of die 102.

In embodiments, a cooling device that incorporates piezoelectric vibrating structures may be incorporated in package 100 to further dissipate heat 108 from die 102. In an embodiment, the cooling device may be a separate device from die 102 that is attached to die 102. In another embodiment, the cooling device may be integrated with die 102 (e.g., a single-piece die-cooling device combination). In an embodiment, the cooling device may include a flexural plate wave (FPW) device on at least one surface of the cooling device. The FPW device generates a stream of air (e.g., a stream of the gas in the environment in which the cooling device is located) that flows over the surface of the cooling device. The stream of air aids in dissipating heat from the cooling device, which includes at least a portion of heat 108 generated by die 102. In this manner, dies 102 is cooled, which may enable the performance and/or reliability of die 102 to be less negatively affected, even entirely unaffected, by heat 108.

Such cooling devices may be implemented in various ways in embodiments. For instance, FIGS. 2-5 depict IC packages that implement cooling devices in accordance with embodiments. FIGS. 2-5 are described as follows.

Figure 2:
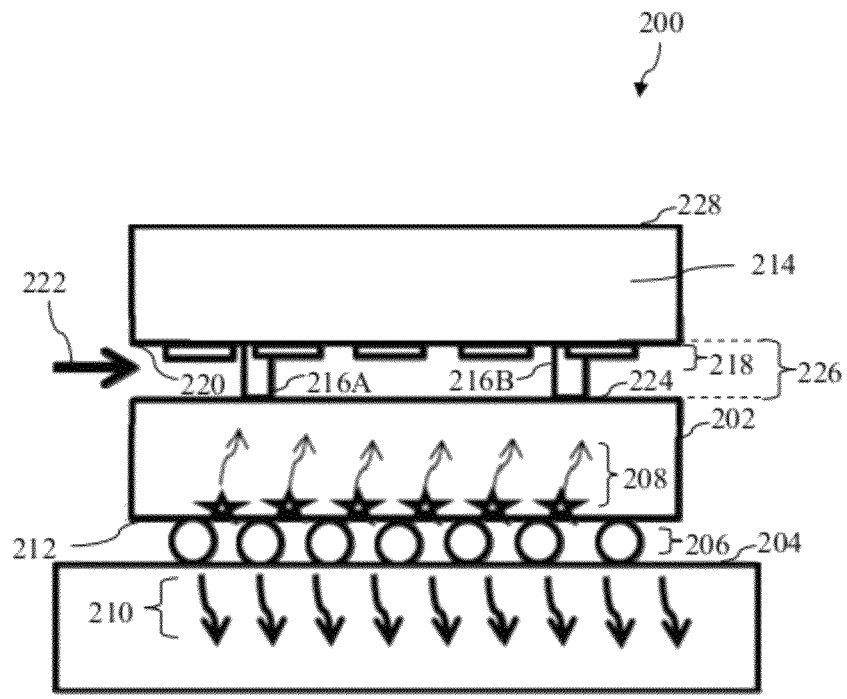
FIGS. 2-5 show side views of IC packages with respective cooling mechanisms included therein, according to example embodiments.

FIG. 2 shows a package 200 mounted to a substrate 204, according to an example embodiment. As shown in FIG. 2, package 200 includes a die 202, a plurality of electrically conductive interconnect elements 206, a cooling device 214, support members 216A and 216B, and a plurality of flexural plate wave (FPW) devices 218. Substrate 204 may be any type of surface or substrate, including a circuit board such as a printed circuit board, an intermediate substrate such as a substrate in an integrated circuit package (e.g., a ball grid array package substrate, etc.), or other type of surface or substrate. Package 200 is described as follows.

Die 202 has opposing first and second surfaces 224 and 212. First surface 224 is a non-active surface of die 202, and second surface 212 is an active surface of die 202. Die 202 may be formed of various semiconductor materials, such as silicon, gallium arsenide, or other type of semiconductor material. Die 202 may have been separated (singulated) from a semiconductor wafer that includes tens, hundreds, or even larger numbers of dies, and that was processed according to photolithographic and/or other techniques to form integrated circuitry in die 202 (and the other dies) that is accessible at second surface 212.

Electrically conductive interconnect elements 206 are on second surface 212 of die 202. Electrically conductive interconnect elements 206 may be applied to second surface 212 in any manner Although shown in FIG. 2 as solder bumps/balls, electrically conductive interconnect elements 206 may be another type of electrically conductive interconnects, including posts, pads, etc. Die 202 has a plurality of die terminals on second surface 212 of die 202 that are I/O pads for signals of die 202. Electrically conductive interconnect elements 206 may be coupled to respective die terminals to at second surface 212 to conduct signals from die 202, or may not be coupled to die terminals of die 202, but may be present to provide mechanical support/stability for mounting package 200 to a substrate, to enable heat conduction from die 202 (e.g., may be thermal bumps/balls), and/or to provide other function/purpose In the example of FIG. 2, package 200 is coupled to substrate 204 by electrically conductive interconnect elements 206. During operation of die 202, heat 208 is produced in die 202. Electrically conductive interconnect elements 206 may be configured to conduct at least some of the heat 208 into substrate 204. For instance, heat 210 is shown in FIG. 2 to be conducted into substrate 204. A temperature of second surface 212 of die 202 at a junction between die 202 and electrically conductive interconnect elements 206 may be represented as the junction temperature Tj (maximum die surface temperature).

In the embodiment of FIG. 2, cooling device 214 is coupled to die 202 through support members 216A and 216B. As shown in FIG. 2, cooling device 214 includes opposing first and second surfaces 220 and 228. Cooling device 214 may be made of any suitable material, including a semiconductor material, a metal (e.g., aluminum, copper, iron, tin, nickel, lead, silver, gold, etc.), a combination of metals/alloy, a ceramic material, a polymer, or other suitable material or combination of materials. Cooling device 214 is configured to be thermally conductive to transfer heat 208 from die 202 received through support members 216A and 216B to the environment. For instance, cooling device 214 may be a heat sink.

Support members 216A and 216B are coupled between first surface 220 of cooling device 214 and first surface 224 of die 202. Support members 216A and 216B mount cooling device 214 to die 202 and form a gap or channel 226 between die 202 and cooling device 214. Two support members 216A and 216B are shown in FIG. 2 for illustrative purposes and this number is not intended to be limiting. It will be recognized that any number of support members 216 may be used to couple cooling device 214 to die 202. For instance, four support members 216A-216D may be present (with each support member positioned near a corresponding corner of die 202 or at other location), six support members 216A-216F may be present, etc. Support members 216 may be made of any suitable material, including a semiconductor material, a metal (e.g., aluminum, copper, iron, tin, nickel, lead, silver, gold, etc.), a combination of metals/alloy, a ceramic material, a polymer, or other suitable material or combination of materials. Support members 216 may be formed in any manner, including as posts, as build-up layers, etc. Support members 216 may be attached to surfaces 220 and 224 in any manner, including by solder, an adhesive material (e.g., a thermally conductive adhesive material), or other material, and may optionally be inserted in recesses/holes in one or both of surfaces 220 and 224. Support members 216 may have any shape, including having circular or rectangular cross-sections.

The region between first surface 220 of cooling device 214 and first surface 224 of die 202 may be referred to as channel 226. Channel 226 has a spacing, gap distance, or height defined by a height (length) of support members 216A and 216B. FPW devices 218 (also referred to as piezoelectric vibrating structures or FPW pumps) are coupled to first surface 220 of cooling device 214. Each of the FPW devices 218 is configured to generate a respective traveling wave. The traveling waves act to pump air 222 through channel 226 along surface 220 of cooling device 214 and surface 224 of die 202. The streaming of air 222 along surface 224 of die 202 acts to dissipate at least some of heat 208 that is produced during the operation of die 202 by flowing air along surface 224 of die 202 to receive some of heat 208 in air 222. For instance, the junction temperature Tj that is described with respect to FIG. 2 may be less than the junction temperature Tj described with respect to FIG. 1 due to the flow of air 222 through channel 226 caused by the traveling waves of FPW devices 218.

Although a plurality of FPW devices 218 are shown on first surface 220 of die 202 in FIG. 2, any number of one or more FPW devices 218 may be present on first surface 2214 of die 202. Furthermore, although FPW devices 218 are shown located on surface 220 of cooling device 214 in FIG. 2, in embodiments, FPW devices 218 may be present on alternative and/or additional surfaces of cooling device 214, including second surface 228 and/or one or more side surfaces of cooling device 214. Furthermore, one or more FPW devices 218 may additionally be present on one or more surfaces of die 202, including second surface 212 and/or one or more side surfaces of die 202.

Figure 3:
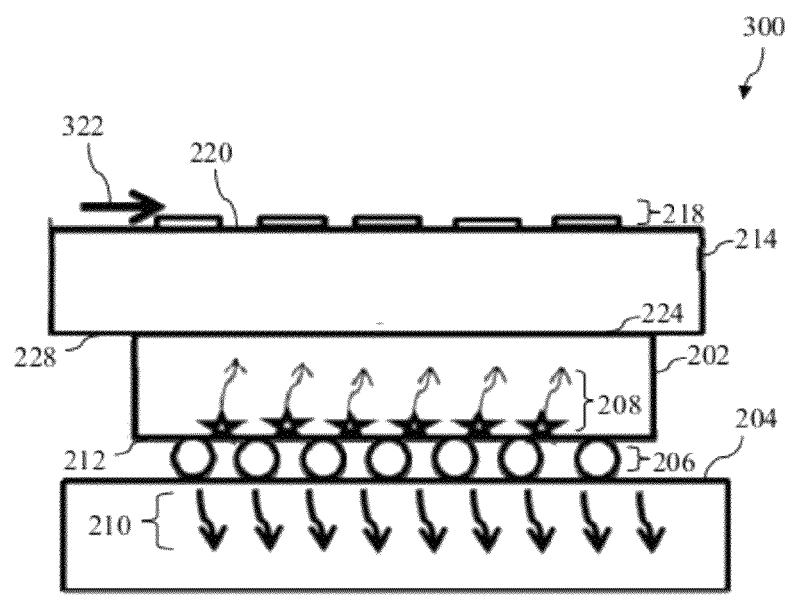

FIG. 3 shows a package 300 mounted to substrate 204, according to another example embodiment. As shown in FIG. 3, package 300 includes die 202, electrically conductive interconnect elements 206, cooling device 214, and FPW devices 218. Package 300 is similar to package 200 of FIG. 2, with differences described as follows.

As shown in FIG. 3, second surface 228 of cooling device 214 is directly coupled to first surface 224 of die 202. Support members 216 of FIG. 2 are not present, and thus channel 226 is not present. Second surface 228 of cooling device 214 may be coupled directly to first surface 224 of die 202 using an adhesive material (e.g., a thermally conductive adhesive material that includes a thermally conductive material, such as a metal such as silver, etc.) as shown in FIG. 3, or may be indirectly coupled to surface 224 of die 202 (e.g., through an intermediate heat sink). FPW devices 218 are coupled to first surface 220 of cooling device 214, which faces away from die 202 in the embodiment of FIG. 3. Each of the FPW devices 218 is configured to generate a respective traveling wave. The traveling waves act to pump air 322 along surface 220 of cooling device 214. The streaming of air 322 along surface 220 of cooling device 214 acts to dissipate at least some of heat 208 that is produced during the operation of die 202. For example, cooling device 214 may conduct at least some of heat 208 from die 202 through cooling device 214 toward surface 220 to be dissipated into air 322.

Figure 4:
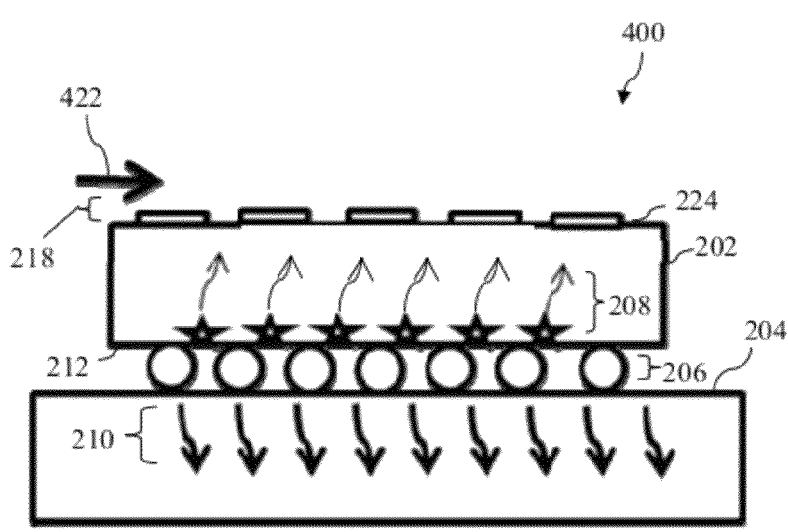

FIG. 4 shows a package 400 mounted to substrate 204, according to another example embodiment. As shown in FIG. 4, package 400 includes die 202, electrically conductive interconnect elements 206, and FPW devices 218. Package 400 is similar to package 200 of FIG. 2, with differences described as follows.

As shown in FIG. 4, FPW devices 218 are on a top surface 224 of a die 202. As such, in the embodiment of FIG. 4, a one-piece cooling device/die (die 202) is present, and a separate cooling device 214 and support members 216A and 216B are not present. As described above, FPW devices 218 are configured to generate respective traveling waves, which collaboratively pump air 422 along surface 224 of die 202. The streaming of air 422 along first surface 224 of die 202 acts to dissipate at least some of heat 208 from die 202 that is produced during the operation of die 202.

Figure 5:
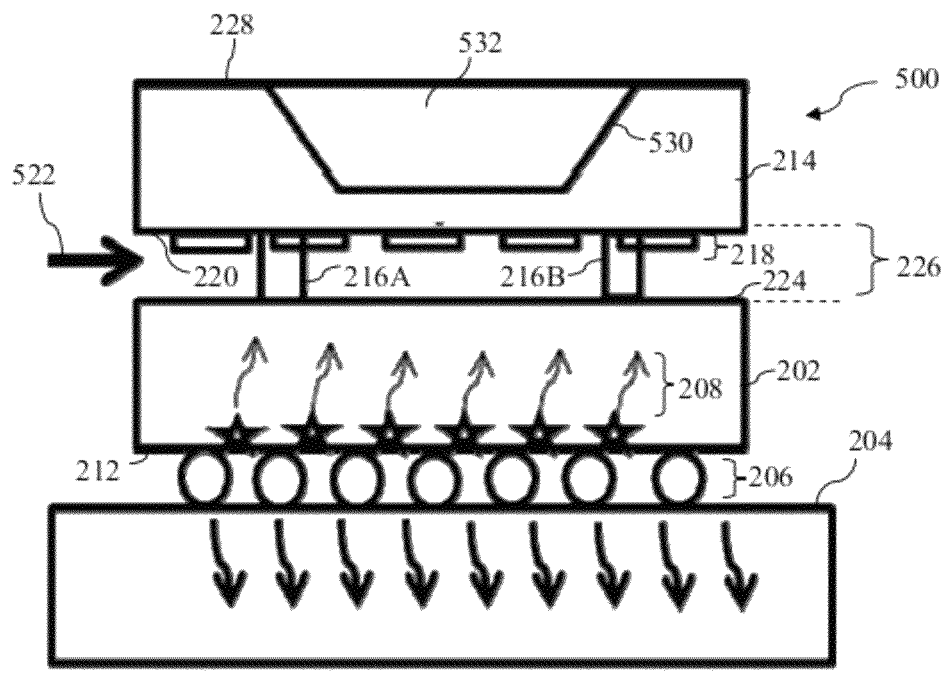

FIG. 5 shows a package 500 mounted to substrate 204, according to another example embodiment. As shown in FIG. 5, package 500 includes die 202, electrically conductive interconnect elements 206, cooling device 214, support members 216A and 216B, and FPW devices 218. Package 500 is similar to package 200 of FIG. 2, with differences described as follows.

As shown in FIG. 5, cooling device 214 is coupled to die 202 by support members 216A and 216B in a similar fashion as described above with respect to FIG. 2. FPW devices 218 are on first surface 220 of cooling device 214. Furthermore, second surface 228 of cooling device 214 includes a centrally-located recessed region 530, rather than second surface 228 being completely planar as shown in FIG. 2. As a result, recessed region 530 forms an air cavity 532 in cooling device 214. Recessed region 530 is shown to have the shape of an isosceles trapezoid in FIG. 5 for illustrative purposes, but is not intended to be limited to this shape. It will be recognized that recessed region 530 may have any suitable shape or combination of shapes, whether regular or irregular, including being rectangular, elliptical, rounded, or other polygonal shape. Furthermore, although a single recessed region 530 is shown in FIG. 5, any number of one or more recessed regions 530 may be present in second surface 228, as well as any number of other features, including slots, openings, fins, etc.

As described above, FPW devices 218 are configured to generate respective traveling waves, which collaboratively pump air 522 along surface 224 of die 202 and surface 220 of cooling device 214 through channel 226 formed between cooling device 214 and die 202. The streaming of air 522 along through channel 226 and along surfaces 220 and 224 acts to dissipate at least some of heat 208 that is produced during the operation of die 202 from die 202 and cooling device 214. Furthermore, the inclusion of recessed region 530 in second surface 228 increases a surface area of second surface 228 of cooling device 214. For example, the increased surface area of surface 228 in FIG. 5 may further facilitate the dissipation of heat from cooling device 214, and thereby from package 500.

Figure 6:
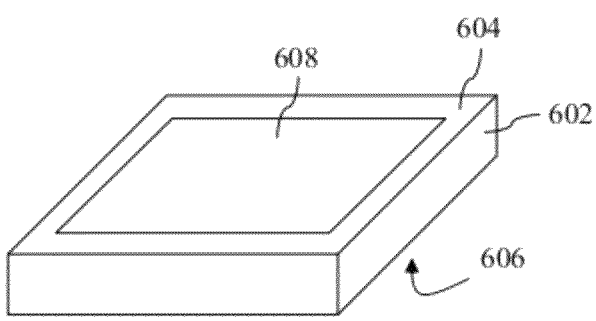
FIG. 6 shows a perspective view of an example cooling device, according to an example embodiment.

As described above, cooling device 214 may be made of a variety of materials, and may be thermally conductive. FIG. 6 shows a perspective view of an example cooing device 600, according to an embodiment. Cooling device 600 is an example of cooling device 204. As shown in FIG. 6, cooling device 600 includes a body 602 having opposing first and second surfaces 604 and 606 (second surface 606 is not visible in FIG. 6). First surface 604 includes a FPW region 608, which may extend to one or more of the edges of first surface 604, and in which one or more FPW devices (e.g., FPW devices 218 of FIGS. 2-5) may be positioned. The FPW devices are configured to generate a stream of air to flow at least across cooling device 600 to cool an integrated circuit (IC) during operation of the integrated circuit (IC). For instance, in an embodiment (e.g., FIGS. 2, 3, and 5) cooling device 600 may be coupled to an IC die (e.g., IC die 202) that includes the integrated circuit. In another embodiment, (e.g., FIG. 4) cooling device 600 may include the integrated circuit (e.g., die 202).

As shown in FIG. 6, cooling device 600 may have a rectangular shape (e.g., square). In other embodiments, cooling device 600 may have other shape, regular or irregular, including being elliptical (e.g., circular), oval, triangular, or other polygonal shape. Furthermore, surfaces 604 and 606 may be completely planar, as shown in FIG. 6, or may include one or more recesses (e.g., holes, depressions, slots, grooves, etc.).

Figure 7:
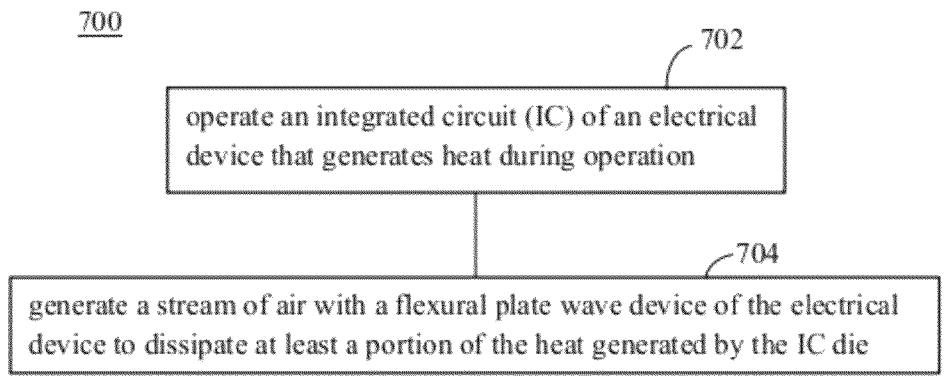
FIG. 7 shows a flowchart providing a process for cooling an electrical device, according to an example embodiment.
Figure 8:
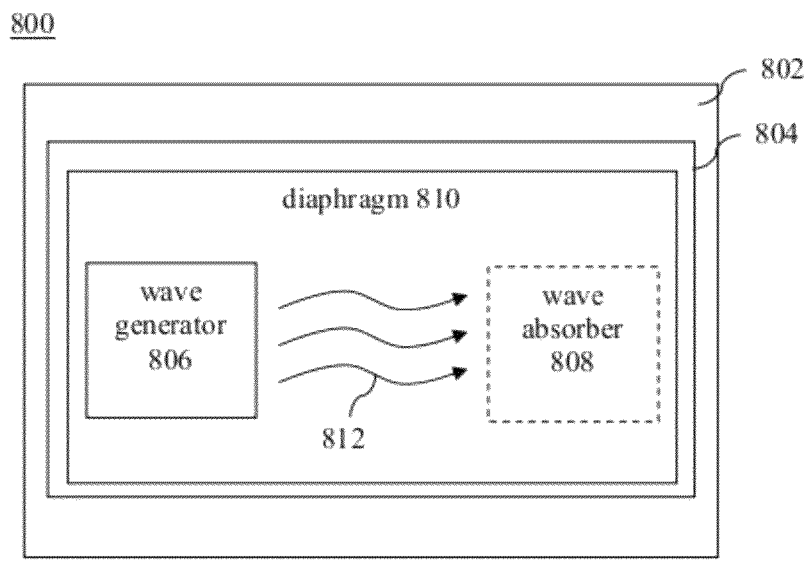
FIG. 8 shows a block diagram view of a surface of an electrical device having a cooling mechanism formed thereon, according to an example embodiment.

Electrical devices that include IC packages with cooling devices may function in various ways to dissipate heat, in embodiments. For instance, FIG. 7 shows a flowchart 700 providing an example process for cooling an electrical device, according to an embodiment. Flowchart 700 is described with respect to FIG. 8 for purposes of illustration. FIG. 8 shows a block diagram view of a surface 802 of an electrical device 800 having a cooling mechanism formed thereon, according to an example embodiment. Electrical device 800 is an example of packages 200, 300, 400, and 500, and of other type of electrical devices enabled for cooling according to embodiments described herein. Other structural and operational embodiments will be apparent to persons skilled in the relevant art(s) based on the discussion provided herein. Flowchart 700 and electrical device 800 are described as follows.

Referring to flowchart 700, in step 702, an integrated circuit (IC) of an electrical device is operated that generates heat during operation. For example, referring to FIG. 8, electrical device 800 may include an integrated circuit that generates heat during operation, as described herein. For instance, surface 802 may be a surface of an integrated circuit die of electrical device 800, which has an integrated circuit incorporated therein (e.g., see package 400 of FIG. 4). In another example, surface 802 may be a surface of a cooling device that is separate from and attached to an integrated circuit die (e.g., see packages 200, 300, and 500 of FIGS. 2, 3, and 5, respectively). As described above, the integrated circuit of the die may generate heat (e.g., heat 208) during operation.

In step 704, a stream of air is generated with a flexural plate wave device of the electrical device to dissipate at least a portion of the heat generated by the IC die. For example, as shown in FIG. 8, surface 802 of electrical device 800 has a FPW device 804 present thereon. FPW device 804 is an example of one of FPW devices 218 described above. Although a single FPW device 804 is shown in FIG. 8, any number of FPW devices 804 may be present on surface 802. As shown in FIG. 8, FPW device 804 includes a wave generator 806, a wave absorber 808, and a diaphragm 810.

Figure 9:
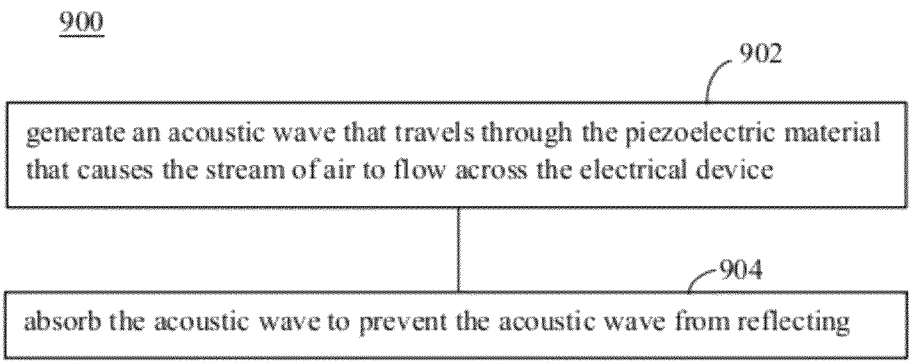
FIG. 9 shows a flowchart providing a process for generating a stream of air to cool an electrical device, according to an example embodiment.

In an embodiment, FPW device 804 is configured to generate a stream of air (e.g., air 222, 322, 422, 522 of FIGS. 2-5, respectively) to dissipate at least a portion of the heat generated by an integrated circuit of electrical device 800. For instance, FPW device 804 may perform step 704 of flowchart 700 according to FIG. 9. FIG. 9 shows a flowchart 900 providing a process for generating a stream of air to cool an electrical device, according to an example embodiment. Other structural and operational embodiments will be apparent to persons skilled in the relevant art(s) based on the discussion provided herein. Flowchart 900 is described as follows.

Referring to flowchart 900, in step 902, an acoustic wave is generated that travels through the piezoelectric material that causes the stream of air to flow across the electrical device. For example, referring to FIG. 8, wave generator 806 may be configured to generate an acoustic wave 812 that travels through diaphragm 810. Acoustic wave 812 may cause the stream of air to flow across surface 802 of electrical device 800 to dissipate heat from electrical device 800. For instance, in an embodiment, diaphragm 810 may be made from a piezoelectric material. Wave generator 806 may generate an electric field in which diaphragm 810 is located. The electric field may cause a mechanical deformation in the piezoelectric material of diaphragm 810 in the form of acoustic wave 812. For instance, the electric field generated by wave generator 806 may be oscillating to cause the piezoelectric material to vibrate to generate acoustic wave 812 to flow through diaphragm 810. Acoustic wave 812 may be generated to produce traveling waves in diaphragm 810 that flow in a predetermined direction (e.g., from wave generator 806 toward wave absorber 808). Air adjacent to surface 802 is caused to flow or stream in the predetermined direction due to friction between the air and acoustic wave 812 traveling through diaphragm 810.

In step 904, the acoustic wave is absorbed to prevent the acoustic wave from reflecting. Step 904 is optional. For example, in an embodiment, wave absorber 808 of FIG. 8 may be configured to perform step 904, and is optionally present. Wave absorber 808 may be configured to absorb acoustic wave 812 generated by wave generator 806 so that acoustic wave 812 does not reflect from an end of diaphragm 810 to return back through the piezoelectric material of diaphragm 810 towards wave generator 806. If acoustic wave 812 is allowed to reflect back towards wave generator 806, acoustic wave 812 may create standing waves in diaphragm 810 due to the superposition of the source wave and wave reflections. Such standing waves would not effectively generate a stream of air, and instead may generate vortexes as described herein.

Figure 10:
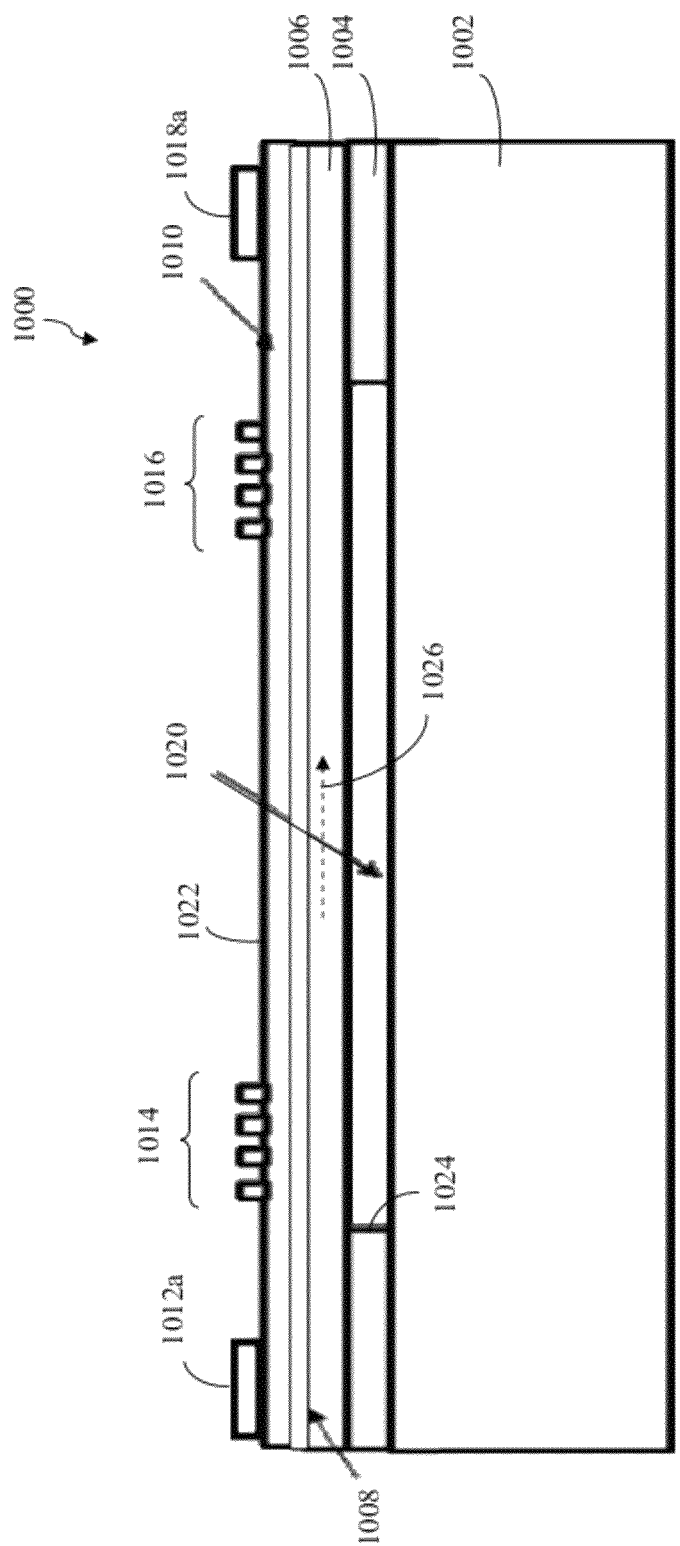
FIG. 10 shows a side cross-sectional view of an example configuration of a flexural plate wave (FPW) device, according to an example embodiment.
Figure 11:
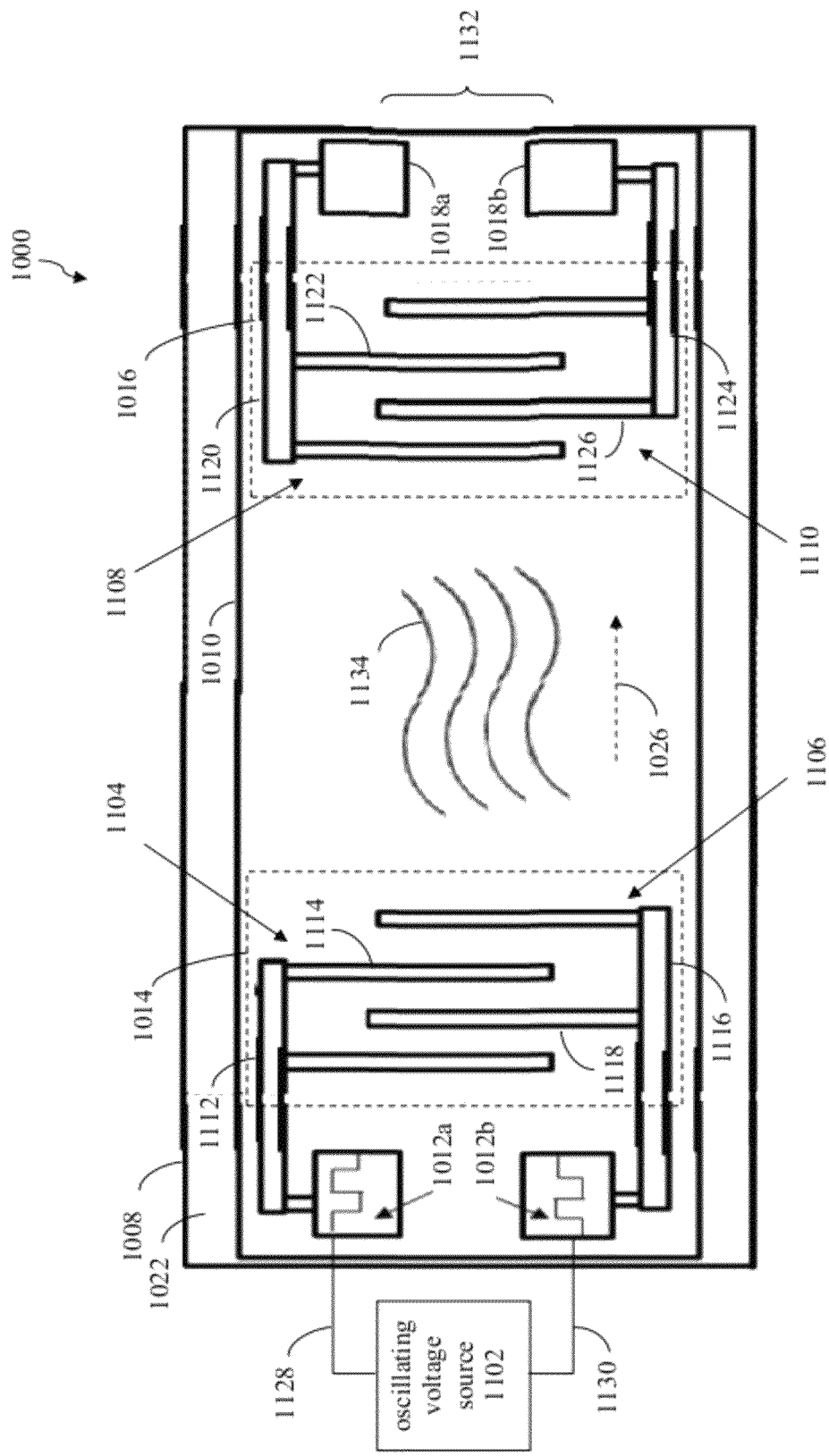
FIG. 11 shows a top view of an example configuration of a FPW device, according to an embodiment.

FPW device 804 may be formed and configured in various ways to perform flowcharts 700 and 900, as described above. Various techniques, including micromachining techniques, photolithography, chemical vapor deposition (CVD), vacuum deposition, and/or other techniques may be used to form FPW device 804. FIG. 10 shows a side cross-sectional view of an example configuration of an FPW device 1000 in accordance with an embodiment. FPW device 1000 is an example of FPW device 804. FIG. 11 shows a surface view of FPW device 1000 of FIG. 10, according to an example embodiment. As shown in FIG. 10, FPW device 100 includes a base layer 1002, a support layer 1004, a diaphragm layer 1006, a dielectric layer 1008, a piezoelectric material layer 1110, a wave generator 1014, a wave absorber 1016, a first input bond pad 1012a, and a first output bond pad 1018a. FPW device 1000 is described as follows.

Base layer 1002 may be considered to be part of FPW device 1000, or may be considered to be separate from FPW device 1000. For example, in one embodiment, base layer 1002 may be a layer formed on a body (e.g., body 602 of FIG. 6) of a cooling device as a first layer of FPW device 1000. In another embodiment, base layer 1002 may be an existing layer of the body of the cooling device or the entirety of the body of cooling device (when the cooling device is single-layer). Base layer 1002 may be formed from one or more materials, including a semiconductor material (e.g., silicon, gallium arsenide, etc.), a metal (e.g., aluminum, copper, iron, tin, nickel, lead, silver, gold, etc.), a combination of metals/alloy, a ceramic material, a polymer, or other suitable material or combination of materials.

As shown in FIG. 10, support layer 1004 coupled to (e.g., attached to or formed on, directly, or indirectly through one or more further layers) base layer 1002. Furthermore, as shown in FIG. 10, support layer 1004 is a planar layer that includes a centrally located opening 1024. Diaphragm layer 1006 is coupled to (e.g., attached to or formed on, directly, or indirectly through one or more further layers) support layer 1004. In the example of FIG. 10, diaphragm layer 1006 is a planar solid layer. Support layer 1004 is configured to support diaphragm layer 1006. As shown in FIG. 10, opening 1024 in support layer 1004 forms an air gap 1020 between base layer 1002 and diaphragm layer 1006, which may enable enhanced flexing of diaphragm layer 1006. Support layer 1004 and diaphragm layer 1006 may each be formed from one or more materials, including a semiconductor material (e.g., silicon, gallium arsenide, a metal (e.g., aluminum, copper, iron, tin, nickel, lead, silver, gold, etc.), a combination of metals/alloy, a ceramic material, a polymer, or other suitable material or combination of materials.

Dielectric layer 1008 is optionally present. When present, dielectric layer 1008 is coupled to (e.g., attached to or formed on, directly, or indirectly through one or more further layers) diaphragm layer 1006. Dielectric layer 1008 may be formed from one or more electrically insulating layers, including a polymer, a ceramic (e.g., silicon nitride), or other suitable material or combination of materials.

Piezoelectric material layer 1010 is coupled to (e.g., attached to or formed on, directly, or indirectly through one or more further layers) dielectric layer 1008. Piezoelectric material layer 1010 may be formed from one or more piezoelectric materials. Example piezoelectric materials for piezoelectric material layer 1010 include aluminum nitride (AlN), zinc oxide (ZnO), etc.

As shown in FIG. 10, wave generator 1014 is formed on (e.g., in contact with) piezoelectric material layer 1010. Wave generator 1014 generates an acoustic wave (acoustic wave 1134 in FIG. 11) that travels through piezoelectric material layer 1010, causing piezoelectric material layer 1010 to vibrate and to cause diaphragm layer 1006 to vibrate, causing a stream of air to flow across surface 1022 of FPW device 1000 in FIG. 10 in a direction 1026 (from wave generator 1014 on a first position of piezoelectric material layer 1010 towards wave absorber 1016 on a second position of piezoelectric material layer 1010). Wave absorber 1016 is formed on piezoelectric material layer 1010. When present, wave absorber 1016 is configured to receive and absorb the acoustic wave to prevent the acoustic wave from reflecting back through piezoelectric material layer 1010 (e.g., from reflecting from a right edge of piezoelectric material layer 1010 in FIG. 10, in a direction opposite to direction 1026).

Although a particular configuration for FPW device 1000 is shown in FIG. 10, FPW device 1000 may include any number of layers, including additional, fewer, and/or alternative layers, to implement its functions. Furthermore, the layers of FPW device 1000 may be formed any suitable combination of materials. In one example embodiment, base layer 1002 is made of silicon, support layer 1004 and diaphragm layer 1006 are made of polysilicon, dielectric layer 1008 is made of silicon nitride, and piezoelectric material layer 1110 is made of aluminum nitride.

Wave generator 1014 and wave absorber 1016 may be configured in various ways to perform their respective functions. For instance, as shown in FIG. 11, wave generator 1014 may include a first comb-shaped electrically conductive feature 1104 and a second comb-shaped electrically conductive feature 1106 formed on piezoelectric material layer 1010. First and second comb-shaped electrically conductive feature 1104 and 1106 are electrically isolated from each other, and are interlocked with each other. As shown in FIG. 11, first comb-shaped electrically conductive feature 1104 includes a base feature 1112 (e.g., an electrical conductor or trace) and a pair of fingers 1114 that extend in a same direction in parallel from base feature 1112, and second comb-shaped electrically conductive feature 1106 includes a base feature 1116 and a pair of fingers 1118 that extend in a same direction in parallel from base feature 1116, in an opposite direction from fingers 1114. Fingers 1114 interlock (e.g., are inter-digitated) with fingers 1118 and are separated by a gap from fingers 1118 on piezoelectric material layer 1010.

A first input bond pad 1012a is coupled to base feature 1112, and a second input bond pad 1012b is coupled to base feature 1116. An oscillating voltage source 1102 is coupled to first and second input bond pads 1012a and 1012b such that a first oscillating signal 1128 is coupled to first comb-shaped electrically conductive feature 1104, and a second oscillating signal 1130 is coupled to second comb-shaped electrically conductive feature 1106. Oscillating voltage source 1102 generates first and second oscillating signals 1128 and 1130 to generate an electric field with first and second comb-shaped electrically conductive features 1104 and 1106. The electric field causes piezoelectric material layer 1010 to vibrate to form an acoustic wave 1134 in piezoelectric material layer 1010, dielectric layer 1008, and diaphragm layer 1006 that travels in the direction of direction 1026.

For instance, oscillating voltage source 1102 may generate first and second oscillating signals 1128 and 1130 to be out of phase (e.g., opposite phase or 180 degrees out of phase) to generate the electric field to be oscillating. The oscillating electric field may cause piezoelectric material layer 1010 to vibrate to generate acoustic waves 1134 as Rayleigh waves, as are known to persons skilled in the relevant art(s). A velocity of Rayleigh waves depends on factors that include the type of piezoelectric material of piezoelectric material layer 1010. If zinc oxide is used as the piezoelectric material, the Rayleigh velocity is about 4 times lower. Hence, with zinc oxide, the frequency of oscillation is also 4 times lower for a same inter-digitated finger spacing of wave generator 1014. When the piezoelectric material is selected, a basic pumping velocity (speed of wave propagation through diaphragm layer 1006) is thereby selected. The actual pumping velocity is then the function of the height of channel 226 (when a channel is present), the amplitude of the acoustic wave (for transfer effect), and a velocity profile across the channel (a function of the air being pumped), as would be known to persons skilled in the relevant art(s) from the teachings herein.

In one embodiment, the Rayleigh wave velocity for the piezoelectric material of piezoelectric material layer 1010 may be used to determine a frequency of oscillating signals 1128 and 1130. Equation 1 shown below indicates a relationship between the Rayleigh wave velocity ($C_R$), wavelength ($\lambda$), and oscillating voltage frequency (f):

$$C_R = \lambda \times f \qquad \text{Equation 1}$$

Figure 12:
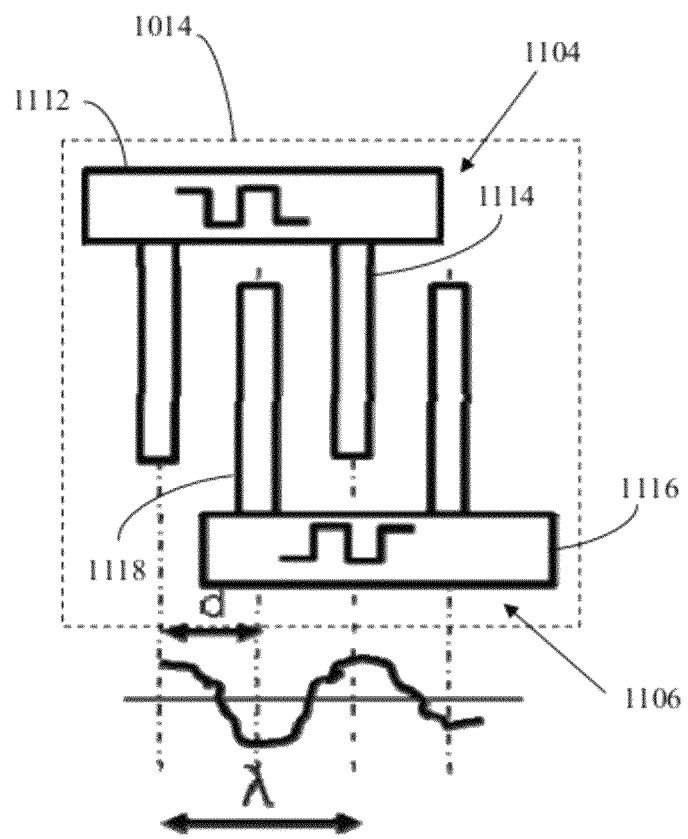
FIG. 12 shows a view of a wave generator to illustrate configuring of acoustic wave wavelength and input signal frequency, according to an example embodiment.

FIG. 12 shows a view of wave generator 1014 of FIG. 11 to illustrate configuring of wavelength $\lambda$, according to an example embodiment. As shown in FIG. 12, wavelength $\lambda$ is equal to 2×distance d, where distance d is a spacing between adjacent interlocked fingers (on different comb-shaped electrically conductive features), and as such, wavelength $\lambda$, is equal to the distance between adjacent fingers on a same comb-shaped electrically conductive feature. Once finger spacing is configured, and wavelength $\lambda$, is thereby determined, frequency f for oscillating signals 1128 and 1130 of FIG. 11 may be determined according to Equation 1 (e.g., $f = C_R/\lambda$). Oscillating signals 1128 and 1130 may be generated by oscillating voltage source 1102 at the determined frequency f as square wave signals (as shown in FIG. 11) or signals having other signal shape.

For instance, if wavelength $\lambda$ is 0.00001 meters, and the Rayleigh wave velocity is 10.4 km/sec (e.g., for MN piezoelectric material in a particular configuration), frequency f may be determined to be 10.4 km/sec/0.00001 meters=1040 MHz. Thus, for a spacing of d=0.000005 meters, and a piezoelectric material of AlN, oscillating signals 1128 and 1130 may be generated to have frequencies of 1040 MHz.

Figure 13:
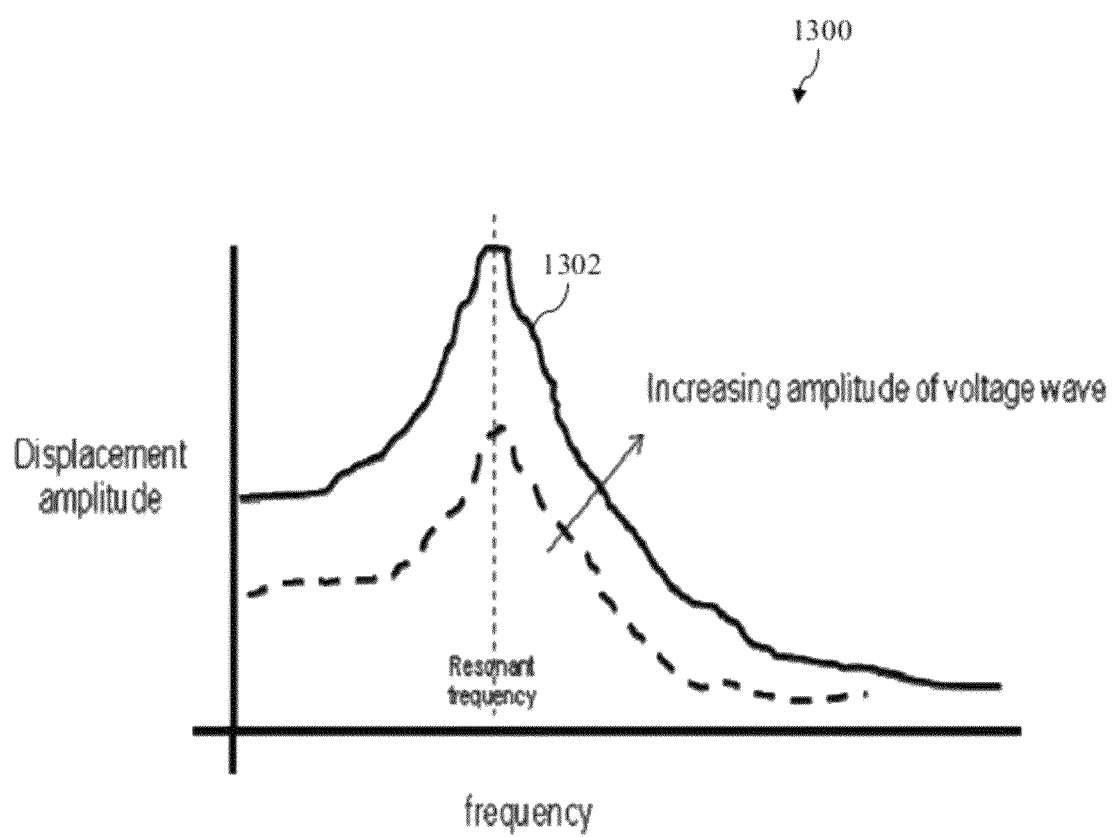
FIG. 13 shows a graph that includes plots of displacement amplitude versus frequency for a diaphragm of a FPW device, according to an example embodiment.

Note that the amplitude of the vibration of piezoelectric material layer 1010 and diaphragm layer 1006 may be selected based on various factors. For instance, FIG. 13 shows a graph 1300 that includes frequency response plots of displacement amplitude versus frequency for a diaphragm of a FPW device in accordance with an example embodiment. For instance, graph 1300 shows a plot 1302 that indicates that a displacement amplitude for a diaphragm (e.g., diaphragm layer 1006) rises from a first level at a vibration frequency of zero to maximum amplitude at a resonant vibration frequency for the diaphragm. As the vibration frequency increases from the resonant frequency, the displacement amplitude for the diaphragm decreases. Furthermore, FIG. 13 indicates that as the amplitude of the voltage wave (e.g., the amplitudes of first and second oscillating signals 1128 and 1130) increases, the entire waveform of plot 1302 is shifted higher (e.g., displacement amplitude of the diaphragm increases with increasing voltage wave).

Note that the piezoelectric efficiency of conversion of voltage to vibration depends on these and various other factors, including the type of piezoelectric material, a crystallographic orientation of the crystals of the piezoelectric material, and a quality of the piezoelectric films.

Referring back to FIG. 11, when present, wave absorber 1016 may include a first comb-shaped electrically conductive feature 1108 and a second comb-shaped electrically conductive feature 1110 formed on piezoelectric material layer 1010. In the example of FIG. 11, first and second comb-shaped electrically conductive features 1108 and 1110 are electrically isolated from each other, and are interlocked with each other. As shown in FIG. 11, first comb-shaped electrically conductive feature 1108 includes a base feature 1120 and a pair of fingers 1122 that extend in a same direction in parallel from base feature 1120, and second comb-shaped electrically conductive feature 1110 includes a base feature 1124 and a pair of fingers 1126 that extend in a same direction in parallel from base feature 1124, in an opposite direction from fingers 1122. Fingers 1122 interlock (e.g., are inter-digitated) with fingers 1126 and are separated by a gap from fingers 1126 on piezoelectric material layer 1010. A first output bond pad 1018a is coupled to base feature 1120, and a second output bond pad 1018b is coupled to base feature 1124. Output bond pads 1018a and 1018b are optional, and a characteristic frequency electrical output may be measured across output bond pad 1018a and 1018b.

Wave absorber 1016 is configured to at least reduce a reflection of acoustic waves 1134 through piezoelectric material layer 1010 (and diaphragm layer 1006 of FIG. 10). As described above, in FIG. 11, first and second comb-shaped electrically conductive features 1108 and 1110 are electrically isolated from each other. In another embodiment, first and second comb-shaped electrically conductive features 1108 and 1110 may be electrically coupled to each other. In this manner, wave absorber 1016 may better absorb acoustic waves 1134 (e.g., form a better termination) to reduce/prevent reflections, and thereby reduce/prevent standing waves.

Figure 14:
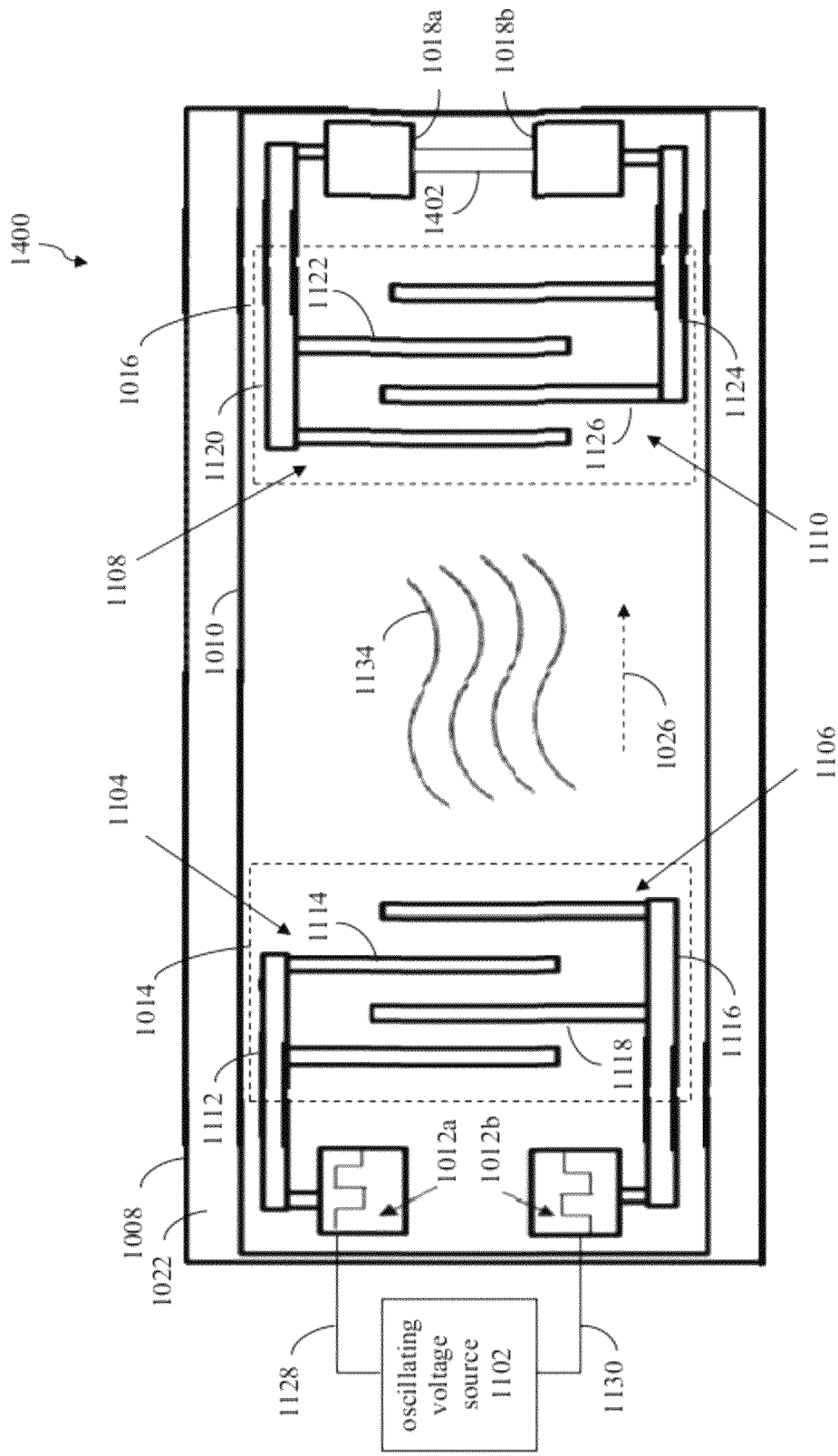
FIG. 14 shows a top view of example configuration of a FPW device, according to an example embodiment.

For example, FIG. 14 shows a surface view of a FPW device 1400, according to an example embodiment. FPW device 1400 is the same as FPW device 1000 of FIG. 11, except that first and second output bond pads 1018a and 1018b are electrically coupled together by an electrical conductor (e.g., a trace) 1402. Furthermore, in an embodiment, first and second output bond pads 1018a and 1018b may be coupled to a ground signal. In this manner, acoustic wave 1134 is more fully or even completely absorbed by wave absorber 1016, preventing reflections of acoustic wave 1134, and enabling acoustic wave 1134 to perform as a traveling wave in piezoelectric material 1010 and diaphragm layer 1006 rather than causing a standing wave.

Note that other configurations for wave generator 1014 and wave absorber 1016 than shown in FIGS. 10-12 and 14 are also applicable to embodiments. Each of first comb-shaped electrically conductive feature 1104, second comb-shaped electrically conductive feature 1106, first input bond pad 1012a, second input bond pad 1012b, first comb-shaped electrically conductive feature 1108, second comb-shaped electrically conductive feature 1110, first output bond pad 1018a, second output bond pad 1018b, and conductor 1402, when present, may each include any number of layers, and may be made of any suitable electrically conductive material, including a metal (e.g., aluminum, copper, iron, tin, nickel, lead, silver, gold, etc.), a combination of metals/alloy (e.g., solder, etc.), and/or one or more other electrically conductive materials. Although pairs of fingers (fingers 1114, 1118, 1122, and 1126) are shown in FIGS. 11 and 14, any number of fingers may be present in each comb-shaped electrically conductive feature, including 3 fingers, 4 fingers, etc. Oscillating voltage source 1102 may be any suitable voltage source that is either separate from a cooling device that includes FPW device 1000/1400, or is associated with or integrated in the cooling device (e.g., incorporated in an integrated circuit die such as die 202, etc.). First and second oscillating signals 1128 and 1130 of oscillating voltage source 1102 may be coupled to input bond pads 1018a and 1018b by any suitable mechanism, including any combination of bond wires, routing, vias, support members, interconnects, etc.

According to embodiments, acoustic streaming is air flow caused by high frequency travelling waves. Acoustic streaming is caused by friction between the medium (e.g., the air) and the vibrating wall (e.g., a diaphragm that vibrates due to one or more FPW devices). Acoustic streaming creates a flow pattern that includes the following effects: (a) convective heat transfer enhancement (vortex type air-flow effect), and (b) an increase in flow velocity (pumping effect). With regard to the pumping effect, a flow rate of air in the vicinity of the vibrating diaphragm is directly proportional to the velocity of the travelling wave. The higher the velocity, the greater is the pumping of air. The actual flow-rate depends on a mean velocity in the channel.

Figure 15B:
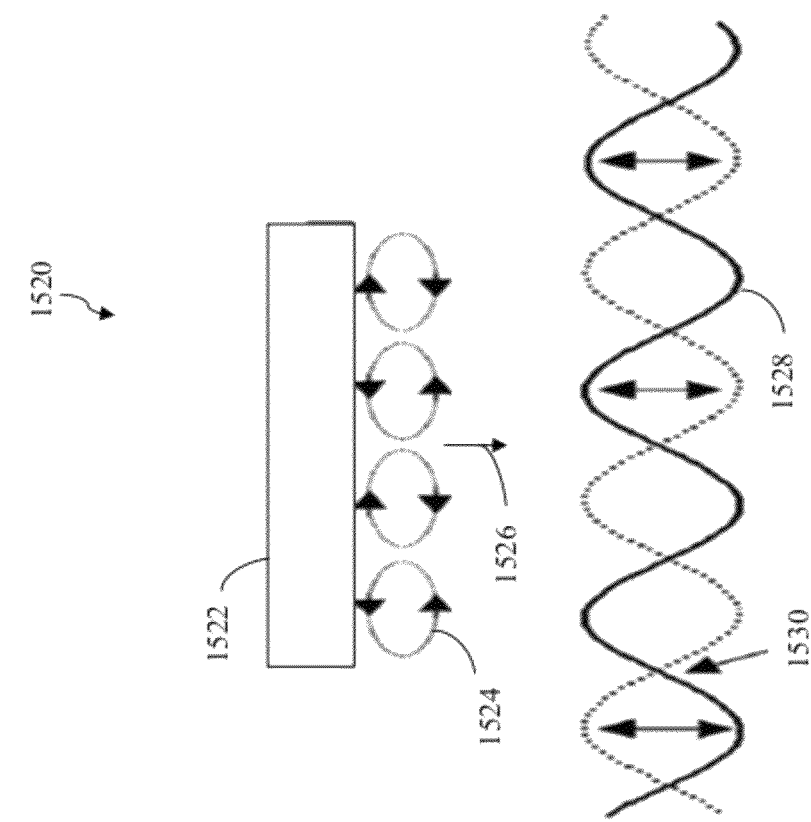
FIGS. 15A and 15B illustrate a pumping effect and a vortex effect for an FPW device, according to an example embodiment.
Figure 15A:
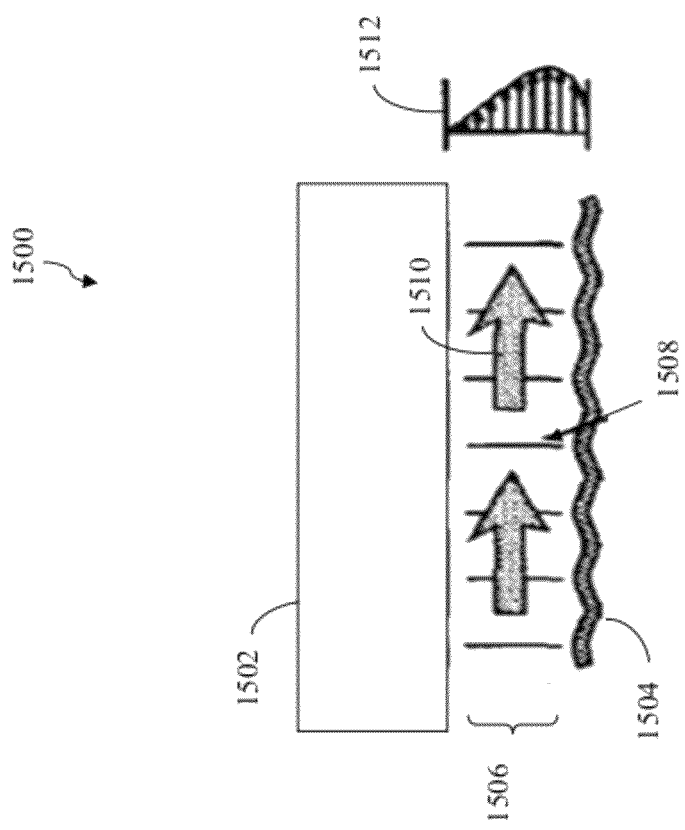

FIGS. 15A and 15B illustrate a pumping effect and a vortex effect that are generated by a cooling device due to acoustic streaming, and that are superimposed on each other, according to embodiment. For example, the pumping effect and the vortex effect each may be produced as a result of traveling waves being produced by FPW devices, such as FPW devices 218 shown in FIGS. 2-5.

FIG. 15A shows a channel configuration 1500 that illustrates the pumping effect, according to an example embodiment. As shown in FIG. 15A, channel configuration 1500 includes a channel cap 1502 and an FPW device 1504 that are separated by a channel 1506 (e.g., similarly to FIGS. 2 and 5). A pumping velocity is indicated by arrows 1510, and acoustic pressure fronts 1508 are also shown. Furthermore, a flow profile 1512 is shown, which illustrates higher channel flow velocities closer to FPW device 1504, and lower channel flow velocities closer to channel cap 1502. Further information regarding acoustic pumping in micromachined flow systems is described in Bradley et al., "Flow Measurements in a Micromachined Flow System with Integrated Acoustic Pumping," Proceedings: IEEE Ultrasonics Symposium, Vol. 1, (1995), which is incorporated by reference herein in its entirety.

FIG. 15B shows a channel configuration 1520 that illustrates the vortex effect. For example, the vortex effect shown in FIG. 15B may occur in a same channel configuration as shown in FIG. 15A, superimposed on the illustrated pumping effect. As shown in FIG. 15B, channel configuration 1520 includes a channel cap (or plate) 1522 and an ultrasonic flexural standing wave 1528 (in a diaphragm of an FPW device). As shown in FIG. 15B, flexural standing wave 1528 has a plurality of nodes 1530, where the standing wave amplitude is zero, and an antinode between each pair of nodes 1530, where the standing wave amplitude is maximal. A plurality of vortexes 1524 are generated in the channel between channel cap 1522 and ultrasonic flexural standing wave 1528. A streaming velocity 1526 indicating air flow from between vortexes that flow in opposite circular directions is shown in FIG. 15B. Air flow indicated according to streaming velocity 1526 rises at antinodes and descends toward nodes 1530 from the channel. Information regarding convective heat transfer due to acoustic streaming with regard to a vibrating beam (aluminum) is described in Loh et al., "Acoustic Streaming Induced by Ultrasonic Flexural Vibrations and Associated Enhancement of Convective Heat Transfer," J. Acoust. Soc. Am., Vol. 111 No. 2, February 2002, pages 875-883, Acoustical Society of America (hereinafter "Loh"), which is incorporated by reference herein in its entirety.

Figure 16:
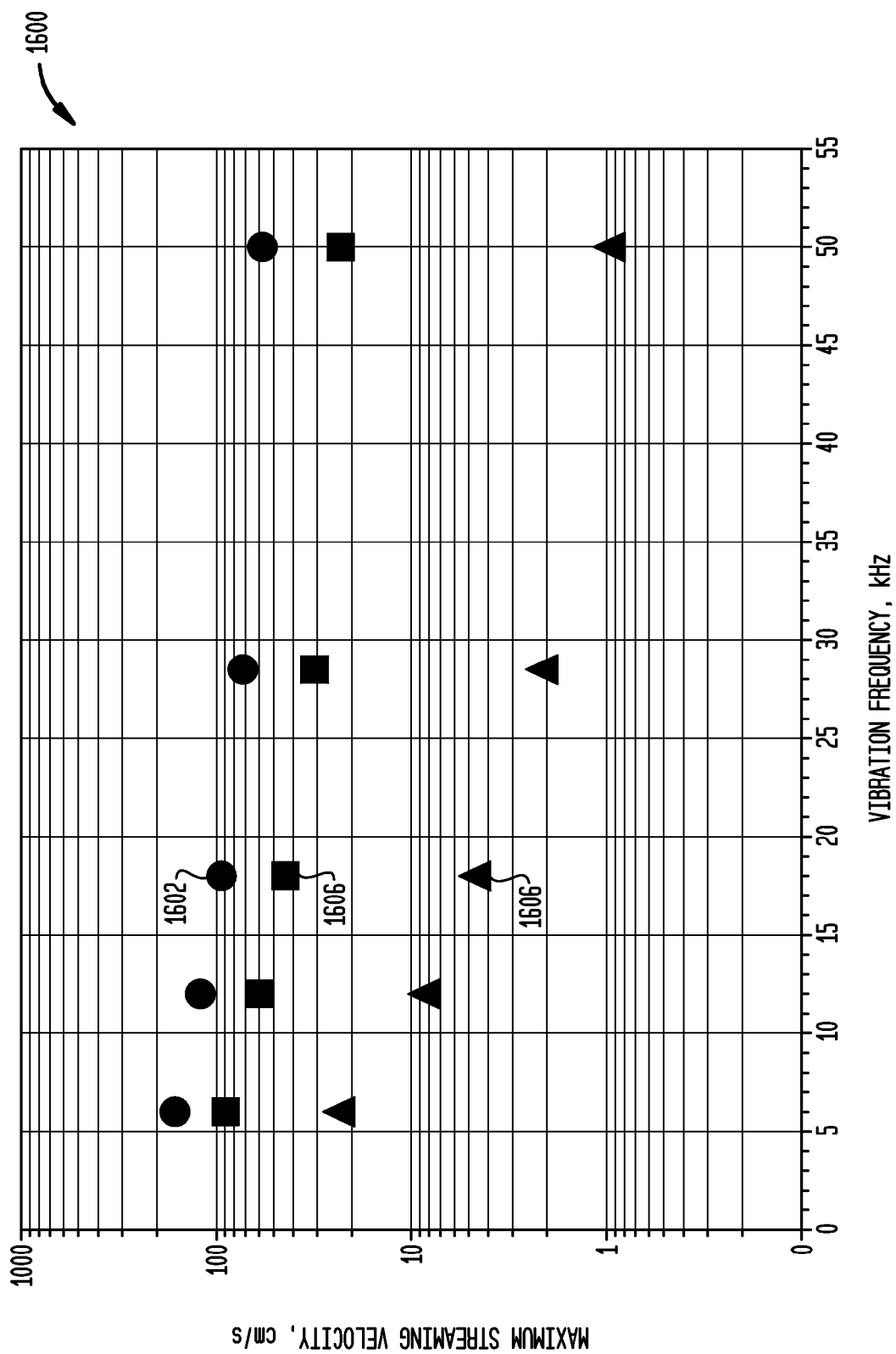
FIG. 16 shows a graph that includes plots of maximum streaming velocity versus vibration frequency for an FPW device, according to an example embodiment.

FIG. 16 shows a graph 1600 that includes plots of maximum streaming velocity versus vibration frequency for an FPW device implemented in a channel configuration (e.g., as in FIGS. 2 and 5), according to an example embodiment. Graph 1600 includes three plots 1602 (circular identifiers), 1604 (square identifiers), and 1606 (triangular identifiers) of maximum streaming velocity measured at a location in the channel (e.g., channel 226) near the diaphragm surface (e.g., surface 220 in FIG. 2), measured at a location in the channel near the surface of channel that opposes the diaphragm surface (e.g., surface 224 in FIG. 2), and calculated using a mathematical model for a location in the channel, respectively. The maximum streaming velocity refers to a maximum velocity at which air flows as a result of traveling waves being produced by FPW devices in a package. The vibration frequency refers to a frequency that is associated with the traveling waves. Graph 1600 indicates that the maximum streaming velocity is greatest for locations near the diaphragm surface (plot 1602), while being least when calculated based on the mathematical model (plot 1606). Furthermore, graph 1600 indicates that as vibration frequency increases, maximum streaming velocity decreases. Refer to Loh, pages 880-881, for further description regarding maximum acoustic streaming velocity for constant vibration velocity for a vibrating beam adjacent to a stationary beam.

Figure 17:
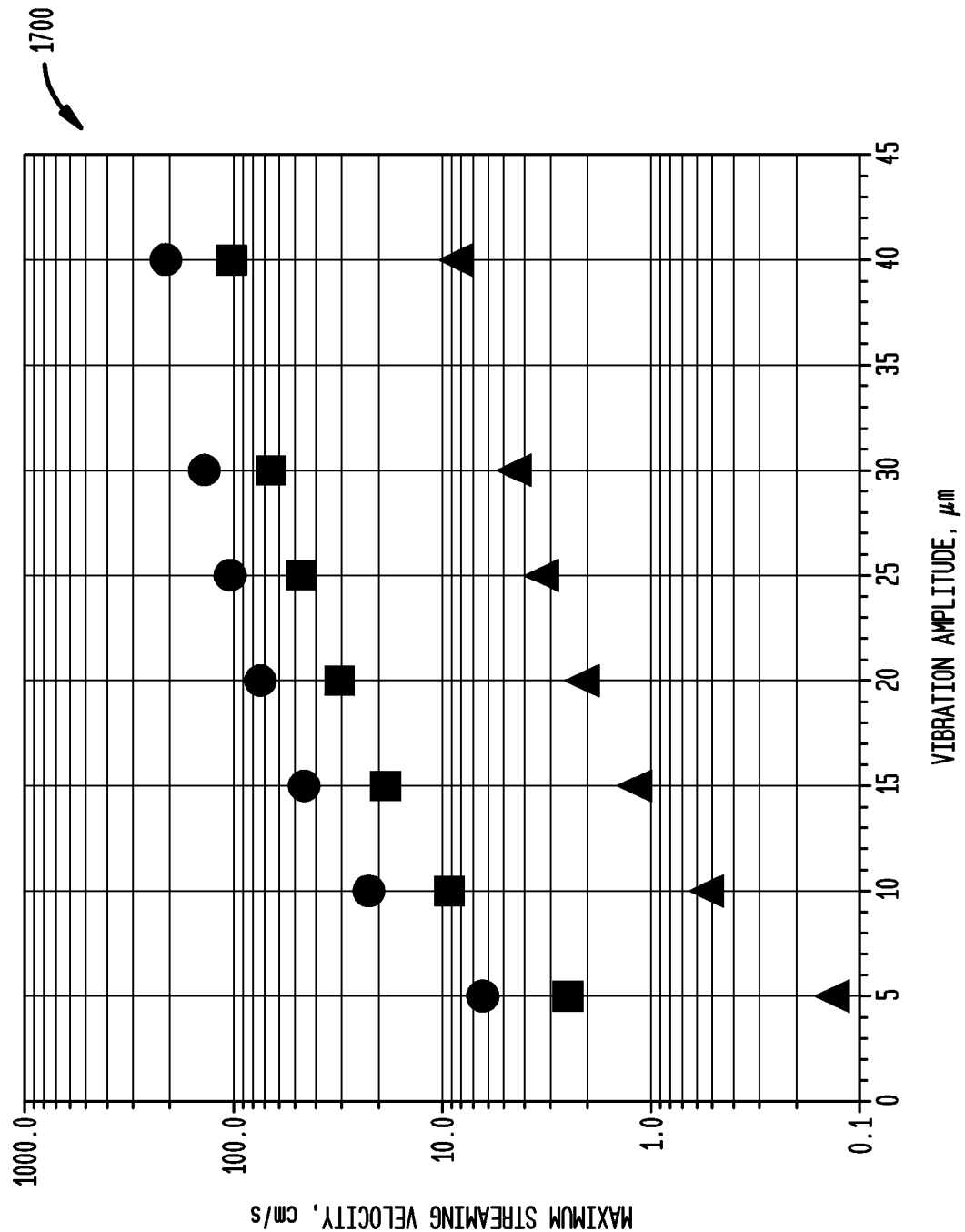
FIG. 17 shows a graph that includes plots of maximum streaming velocity versus vibration amplitude for an FPW device, according to an example embodiment.

FIG. 17 shows a graph 1700 that includes plots of maximum streaming velocity versus vibration amplitude for an FPW device implemented in a channel configuration, according to an example embodiment. Graph 1700 includes three plots 1702 (circular identifiers), 1704 (square identifiers), and 1706 (triangular identifiers) of maximum streaming velocity measured at a location in the channel near the diaphragm surface, measured at a location in the channel near the surface of channel that opposes the diaphragm surface, and calculated using a mathematical model for a location in the channel, respectively. The maximum streaming velocity refers to a maximum velocity at which air flows as a result of traveling waves being produced by FPW devices in a package. The vibration amplitude refers to an amplitude of the traveling waves. For example, the amplitude may be an average amplitude of the traveling waves or a mean amplitude of the traveling waves, though the scope of the example embodiments is not limited in this respect. Graph 1700 indicates that the maximum streaming velocity is greatest for locations near the diaphragm surface (plot 1702), while being least when calculated based on the mathematical model (plot 1706). Furthermore, graph 1700 indicates that as vibration amplitude increases, maximum streaming velocity increases. Refer to Loh, page 881, for further description regarding maximum acoustic streaming velocity for different vibration amplitude for a vibrating beam adjacent to a stationary beam.

Figure 18:
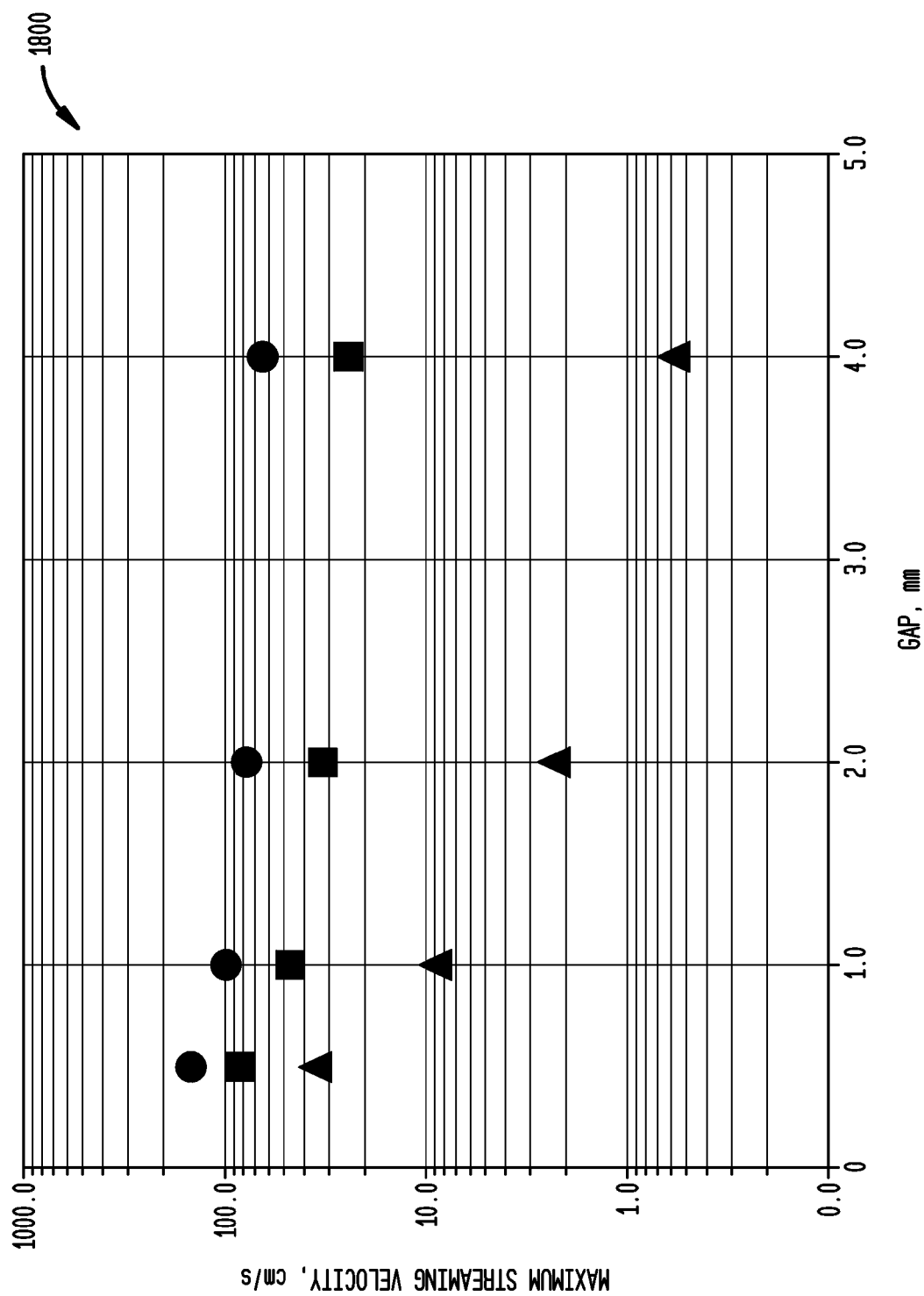
FIG. 18 shows a graph that includes plots of maximum streaming velocity versus a gap distance between upper and lower beams of a FPW device, according to example embodiments.

FIG. 18 shows a graph 1800 that includes plots of maximum streaming velocity versus a gap distance between the opposing channel surfaces (e.g., surfaces 220 and 224 in FIG. 2) of a FPW device implemented in a channel configuration, according to example embodiments. Graph 1800 includes three plots 1802 (circular identifiers), 1804 (square identifiers), and 1806 (triangular identifiers) of maximum streaming velocity measured at a location in the channel near the diaphragm surface, measured at a location in the channel near the surface of channel that opposes the diaphragm surface, and calculated using a mathematical model for a location in the channel, respectively. The maximum streaming velocity refers to a maximum velocity at which air flows as a result of traveling waves being produced by the FPW device. Graph 1800 indicates that the maximum streaming velocity is greatest for locations near the diaphragm surface (plot 1802), while being least when calculated based on the mathematical model (plot 1806). Furthermore, graph 1800 indicates that as the gap distance increases, maximum streaming velocity decreases. Refer to Loh, page 881, for further description regarding maximum acoustic streaming velocity for different gap size for a vibrating beam adjacent to a stationary beam.

Figure 19:
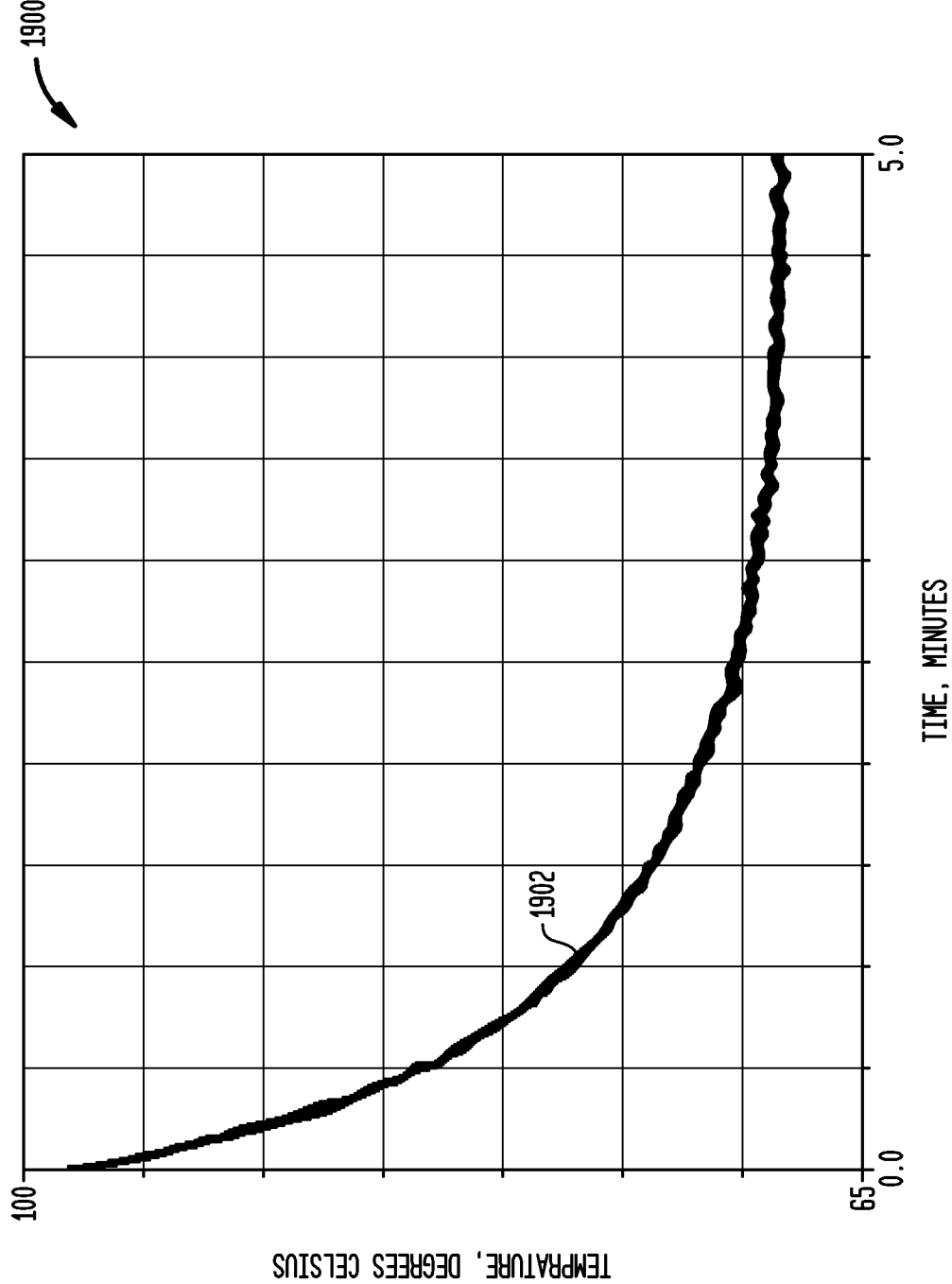
FIG. 19 shows a graph that includes a plot of die temperature versus time, according to an example embodiment.

FIG. 19 shows a graph 1900 that includes a plot 1902 of die temperature versus time, according to an example embodiment. FIG. 19 illustrates an effect of vortex generation on a temperature of a die. In graph 1900, time is represented along an X-axis and temperature is represented along a Y-axis. The time along the X-axis is depicted in 0.5 minute increments from zero minutes to five minutes. The temperature along the Y-axis is depicted in 5° C. increments from 65° C. to 100° C. Plot 1900 includes a plot 1902 for which temperature is shown to decrease exponentially from approximately 97° C. at a time of zero minutes to approximately 68° C. at a time of five minutes. For instance, at time 0.0, where there is no vortex yet established by a FPW device, the temperature is maximum (e.g., 97° C.). At time 5.0 minutes, after the vortex effect (e.g., a 21 KHz vortex) has been established for several minutes, the temperature has decreased to a lower steady state temperature (e.g., 68° C.).

Figure 20:
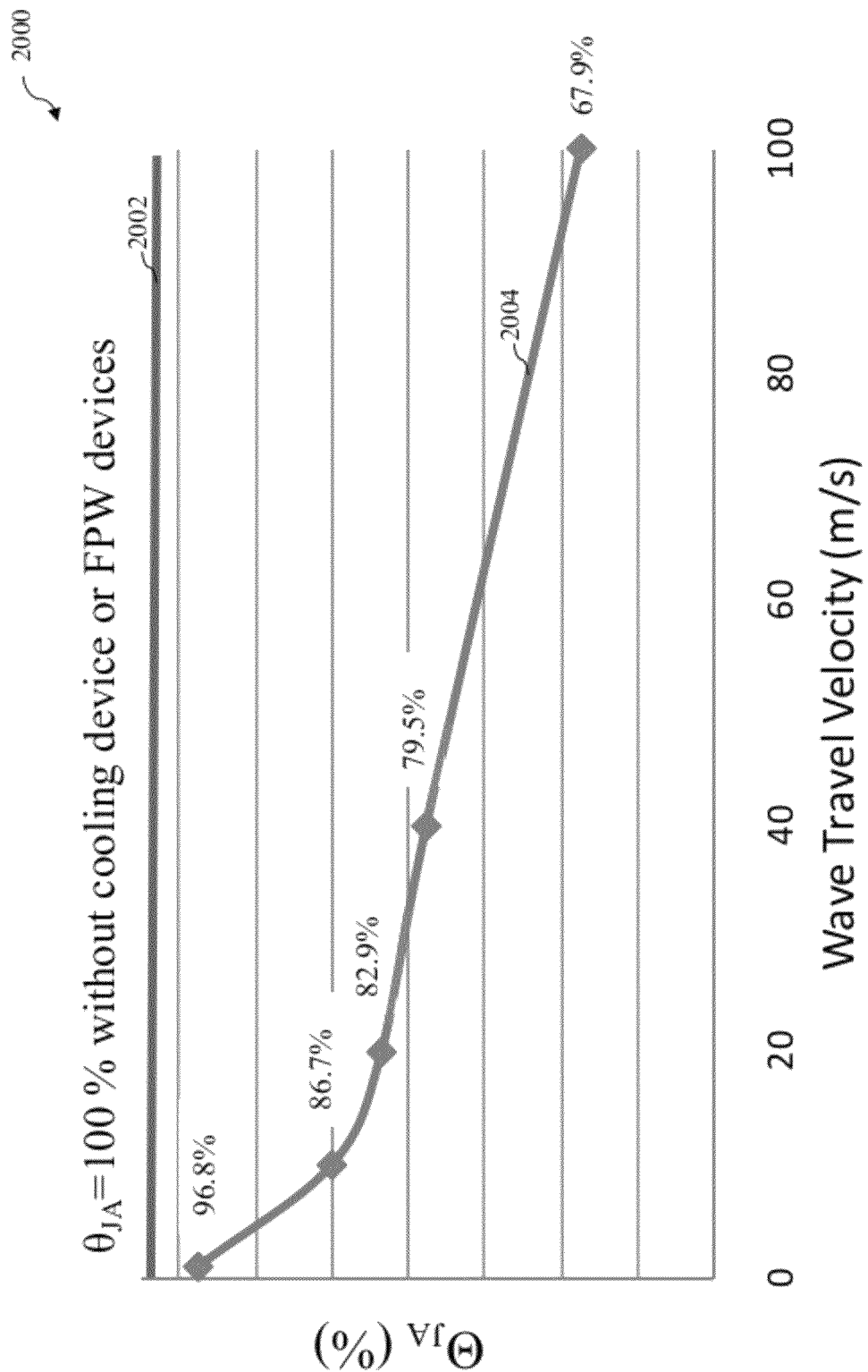
FIG. 20 shows a graph that includes plots of junction-to-ambient thermal resistances with respect to a wave travel velocity, according to an example embodiment.

FIG. 20 shows a graph 2000 that includes plots of junction-to-ambient thermal resistances (ΘJA) with respect to a wave travel velocity in accordance with an embodiment. Junction-to-ambient thermal resistance ΘJA may be determined according to Equation 2 shown below:

$$\Theta JA = (TJ-TA)/\text{device power} \quad \text{Equation 2}$$

where
TJ=junction temperature,
TA=ambient temperature, and
device power=die active surface power.

Graph 2000 includes plots 2002 and 2004. Plot 2002 represents junction-to-ambient thermal resistances for an electrical device that does not include a cooling device or FPW devices. As depicted by plot 2002, the junction-to-ambient thermal resistance for an electronic device that does not include a cooling device/FPW device remains substantially constant at approximately 100% for wave travel velocities from 0 m/s to 100 m/s. Plot 2004 represents junction-to-ambient thermal resistances for an electrical device that does include a cooling device and FPW device. As depicted by plot 2004, the junction-to-ambient thermal resistance for an electrical device that does include a cooling device and FPW devices decreases from approximately 96.8% at a wave travel velocity of approximately 0 m/s to approximately 67.9% at a wave travel velocity of approximately 100 m/s. The slope of plot 2004 is more negative between wave travel velocities of 0 m/s to approximately 20 m/s than between wave travel velocities of approximately 20 m/s to 100 m/s. The slope of plot 2004 is shown to be substantially linear between wave travel velocities of approximately 20 m/s to 100 m/s. Accordingly, cooling devices with FPW devices offer substantial reductions in junction-to-ambient (die-to-ambient) thermal resistance for electrical devices, particularly as wave travel velocity is increased for an FPW device.

Figure 21:
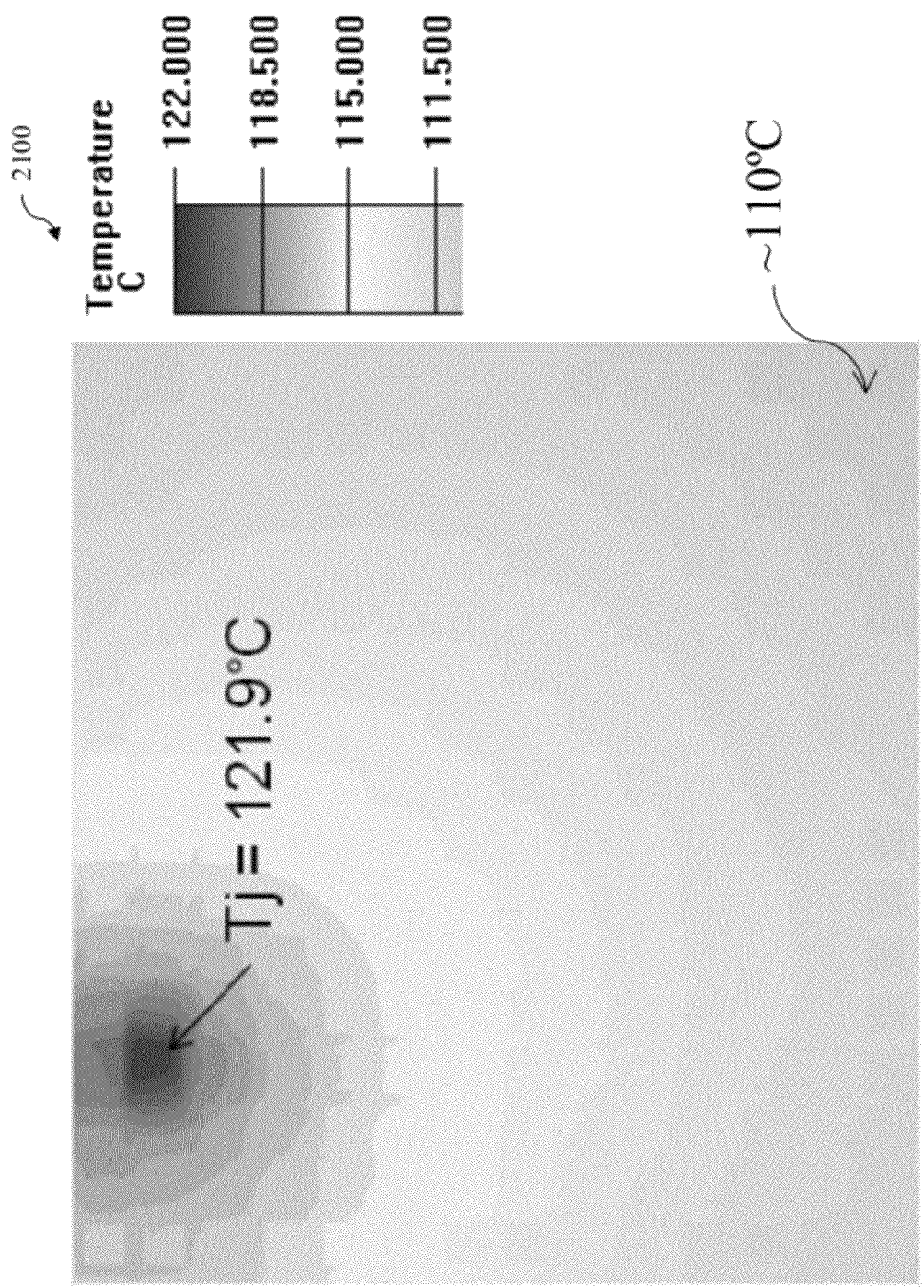
FIG. 21 shows a modeled temperature distribution for an IC die that does not include a FPW device, according to an example embodiment.
Figure 22:
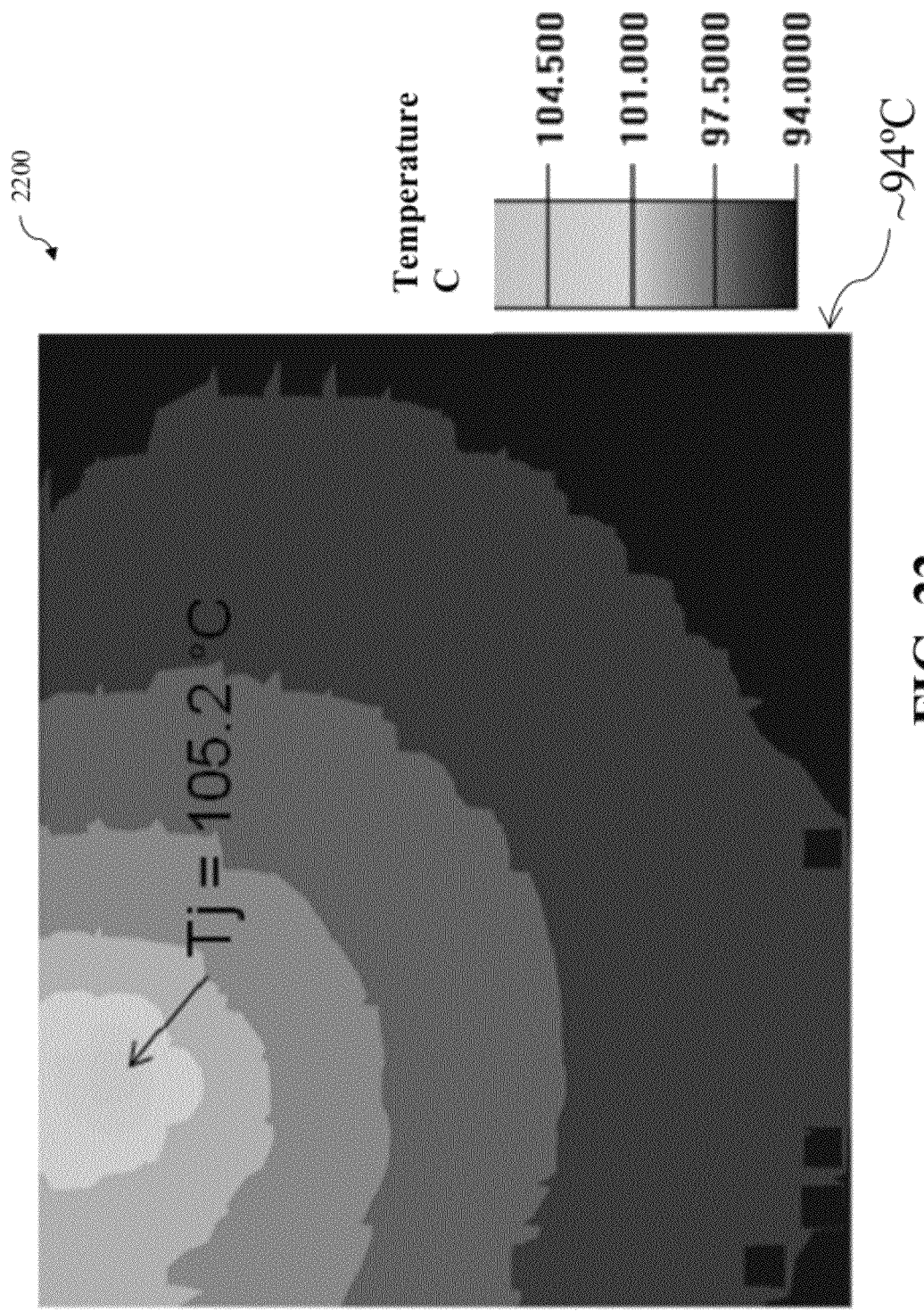
FIG. 22 shows a modeled temperature distribution for an IC die that includes a cooling device, according to an example embodiment.

FIGS. 21 and 22 show thermal modeling images of die surfaces that illustrate cooling provided by embodiments. Modeling details associated with FIGS. 21 and 22 include a die utilized power of 1.5 Watts, an ambient temperature of 70° C., and a JEDEC standard Zero Airflow enclosure. For instance, FIG. 21 shows a modeled temperature distribution 2100 for an IC die that does not include a FPW device, according to an example embodiment. As indicated by temperature distribution 2100 shown in FIG. 21, the un-cooled die surface has a hot spot of 121.9° C., and the die surface temperature decreases as distance increases from the hot spot to a temperature of approximately 110° C.

FIG. 22 shows a modeled temperature distribution for an IC die that includes a cooling device, according to an example embodiment. As indicated by temperature distribution 2200 shown in FIG. 22, the hot spot for the cooled die surface has been reduced in temperature relative to FIG. 21 to 121.9° C. (for a wave velocity of 100 m/sec), and the die surface temperature decreases as distance increases from the hot spot to a temperature of approximately 94° C.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An electrical device, comprising:
   an integrated circuit (IC) die having opposing first and second surfaces;
   a plurality of interconnects on the second surface of the IC die that enable the IC die to be coupled to a substrate; and
   a flexural plate wave device configured to generate a stream of air to flow across the electrical device to cool the IC die during operation of the IC die, wherein the flexural plate wave device comprises:
   a base layer;
   a support layer coupled to the base layer;
   a diaphragm layer coupled to the support layer, the support layer including an opening to form an air gap between the base layer and the diaphragm layer;
   a piezoelectric material layer coupled to the diaphragm layer; and
   a wave generator formed on the piezoelectric material layer that is configured to generate an acoustic wave that travels through the piezoelectric material layer, the acoustic wave causing the stream of air to flow across the electrical device.

2. The electrical device of claim 1, further comprising:
   a cooling device having opposing first and second surfaces, wherein the cooling device is coupled to the IC die, and the flexural plate wave device is on the first surface of the cooling device.

3. The electrical device of claim 2, further comprising:
   a plurality of support members coupled between the first surface of the cooling device and the first surface of the IC die that mount the cooling device to the IC die and form a channel between the IC die and the cooling device;
wherein the stream of air generated by the flexural plate wave device flows through the channel.

4. The electrical device of claim 1, wherein the wave generator comprises:
a first comb-shaped electrically conductive feature; and
a second comb-shaped electrically conductive feature electrically isolated from and interlocked with the first comb-shaped electrically conductive feature;
wherein a first oscillating signal is coupled to the first comb-shaped electrically conductive feature, and a second oscillating signal is coupled to the second comb-shaped electrically conductive feature.

5. The electrical device of claim 1, further comprising:
a wave absorber formed on the piezoelectric material layer configured to receive and absorb the acoustic wave to at least reduce a reflection of the acoustic wave through the piezoelectric material layer.

6. The electrical device of claim 5, wherein the wave absorber comprises:
a first comb-shaped electrically conductive feature; and
a second comb-shaped electrically conductive feature interlocked with the first comb-shaped electrically conductive feature.

7. The electrical device of claim 6, wherein the second comb-shaped electrically conductive feature is electrically coupled to the first comb-shaped electrically conductive feature.

8. A cooling device, comprising:
a body that has opposing first and second surfaces; and
a flexural plate wave device on the first surface that is configured to generate a stream of air to flow at least across the cooling device to cool an integrated circuit (IC) during operation of the integrated circuit (IC), wherein the flexural plate wave device comprises:
a support layer coupled to the body;
a diaphragm layer coupled to the support layer, the support layer including an opening to form an air gap between the body and the diaphragm layer;
a piezoelectric material layer coupled to the diaphragm layer; and
a wave generator formed in contact with the piezoelectric material layer that is configured to generate an acoustic wave that travels through the piezoelectric material layer, the acoustic wave causing the stream of air to flow at least across the cooling device.

9. The cooling device of claim 8, further comprising:
a plurality of support members on the first surface of the body configured to mount the cooling device to an IC die and form a channel between the IC die and the cooling device;
wherein the stream of air generated by the flexural plate wave device flows through the channel.

10. The cooling device of claim 8, wherein the wave generator comprises:
a first comb-shaped electrically conductive feature; and
a second comb-shaped electrically conductive feature electrically isolated from and interlocked with the first comb-shaped electrically conductive feature;
wherein a first oscillating signal is coupled to the first comb-shaped electrically conductive feature, and a second oscillating signal is coupled to the second comb-shaped electrically conductive feature.

11. The cooling device of claim 8, further comprising:
a wave absorber formed in contact with the piezoelectric material layer configured to receive and absorb the acoustic wave to prevent the acoustic wave from reflecting through the piezoelectric material layer.

12. A method, comprising:
operating an integrated circuit (IC) of an electrical device that generates heat during operation; and
generating a stream of air with a flexural plate wave device of the electrical device to dissipate at least a portion of the heat generated by the IC die, wherein the flexural plate wave device comprises:
a base layer;
a support layer coupled to the base layer;
a diaphragm layer coupled to the support layer, the support layer including an opening to form an air gap between the base layer and the diaphragm layer;
a piezoelectric material layer coupled to the diaphragm layer; and
a wave generator formed on the piezoelectric material layer that is configured to generate an acoustic wave that travels through the piezoelectric material layer; and
wherein the method further comprises:
generating the acoustic wave to cause the stream of air to flow across the electrical device.

13. The method of claim 12, wherein a plurality of support members are coupled between a first surface of the cooling device and the IC die that mount the cooling device to the IC die and form a channel between the IC die and the cooling device;
wherein the method further comprises:
generating the stream of air by the flexural plate wave device to flow through the channel.

14. The method of claim 12, wherein the wave generator comprises:
a first comb-shaped electrically conductive feature; and
a second comb-shaped electrically conductive feature electrically isolated from and interlocked with the first comb-shaped electrically conductive feature;
wherein the method further comprises:
coupling a first oscillating signal to the first comb-shaped electrically conductive feature, and
coupling a second oscillating signal to the second comb-shaped electrically conductive feature.

15. The method of claim 12, wherein the flexural plate wave device further comprises:
a wave absorber formed on the piezoelectric material layer; and
wherein the method further comprises:
absorbing the acoustic wave with the wave absorber to at least reduce a reflection of the acoustic wave through the piezoelectric material layer.

16. The method of claim 15, wherein the wave absorber comprises:
a first comb-shaped electrically conductive feature; and
a second comb-shaped electrically conductive feature interlocked with the first comb-shaped electrically conductive feature.

17. An electrical device, comprising:
an integrated circuit (IC) die having opposing first and second surfaces;
a plurality of interconnects on the second surface of the IC die that enable the IC die to be coupled to a substrate;
a flexural plate wave device configured to generate a stream of air to flow across the electrical device to cool the IC die during operation of the IC die; and a wave generator configured to generate an acoustic wave that travels through at least a portion of the flexural plate wave device, the acoustic wave causing the stream of air to flow at least across the IC die.

18. The electrical device of claim 17, further comprising:
a cooling device having opposing first and second surfaces, wherein the cooling device is coupled to the IC die, and the flexural plate wave device is on the first surface of the cooling device.

19. The electrical device of claim 18, further comprising:
a plurality of support members coupled between the first surface of the cooling device and the first surface of the IC die that mount the cooling device to the IC die and form a channel between the IC die and the cooling device;
wherein the stream of air generated by the flexural plate wave device flows through the channel.

20. The electrical device of claim 17, wherein the wave generator comprises:
a first comb-shaped electrically conductive feature; and
a second comb-shaped electrically conductive feature electrically isolated from and interlocked with the first comb-shaped electrically conductive feature;
wherein a first oscillating signal is coupled to the first comb-shaped electrically conductive feature, and a second oscillating signal is coupled to the second comb-shaped electrically conductive feature.

21. A cooling device, comprising:
a body that has opposing first and second surfaces; and
a flexural plate wave device on the first surface that is configured to generate a stream of air to flow at least across the cooling device to cool an integrated circuit (IC) during operation of the integrated circuit (IC), wherein the flexural plate wave device comprises:
a wave generator configured to generate an acoustic wave that travels through at least a portion of the flexural plate wave device, the acoustic wave causing the stream of air to flow at least across the cooling device.

22. The cooling device of claim 21, further comprising:
a plurality of support members on the first surface of the cooling device configured to mount the cooling device to an IC die and form a channel between the IC die and the cooling device;
wherein the stream of air generated by the flexural plate wave device flows through the channel.

* * * * *